(12) United States Patent
Kobayashi et al.

(10) Patent No.: US 6,388,277 B1
(45) Date of Patent: May 14, 2002

(54) AUTO PLACEMENT AND ROUTING DEVICE AND SEMICONDUCTOR INTEGRATED CIRCUIT

(75) Inventors: Hiroyuki Kobayashi; Yukihiko Shimazu, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/197,697

(22) Filed: Nov. 23, 1998

(30) Foreign Application Priority Data

Jul. 14, 1998 (JP) .......................................... P10-198759

(51) Int. Cl.⁷ ............................................. H01L 27/10
(52) U.S. Cl. ........................ 257/207; 438/129; 345/98; 345/100
(58) Field of Search ................................ 438/129, 128; 345/98, 100; 257/207

(56) References Cited

U.S. PATENT DOCUMENTS 6,011,535 A * 1/2000 Katoh et al. .................. 345/98
6,072,456 A * 6/2000 Karube et al. ................ 345/98

FOREIGN PATENT DOCUMENTS

JP          7-141406          6/1995

* cited by examiner

Primary Examiner—Wael Fahmy
Assistant Examiner—Hsing-Ming Lee
(74) Attorney, Agent, or Firm—Oblon, Spivak, McClelland, Maier & Neustadt, P.C.

(57) ABSTRACT

An auto placement and routing device lays out wiring with consideration for influences of an increase in an effective coupling capacitance. A layout data generation unit 11 allots signal lines ($2_1$ to $2_7$) to grids ($1_1$, $1_3$, $1_5$, $1_7$, $1_9$, $1_{11}$, $1_{13}$), respectively. The signal lines ($2_1$, $2_3$, $2_5$, $2_7$) have a signal attribute B, and the signal lines ($2_2$, $2_4$, $2_6$) have a signal attribute A. Thus, the signal line having the signal attribute A and the signal line having the signal attribute B are placed by turns so that the signal lines having the same signal attribute are not to be adjacent to each other. Accordingly, the potential transitions of the signal lines ($2_3$, $2_5$) adjacent to an observed signal line ($2_4$) do not take place at a time when the potential transition of the observed signal line ($2_4$) takes place. This prevents an increase in the effective coupling capacitance of the observed signal line ($2_4$) due to the potential transitions of the signal lines ($2_3$, $2_5$) adjacent to the observed signal line ($2_4$).

8 Claims, 19 Drawing Sheets

AUTO PLACEMENT AND ROUTING DEVICE AND SEMICONDUCTOR INTEGRATED CIRCUIT

BACKGROUND OF THE INVENTION

1. Field of the Invention

The present invention relates to an auto placement and routing device for laying out wiring in a semiconductor integrated circuit, and the semiconductor integrated circuit including the wiring laid out by the auto placement and routing device.

2. Background of the Invention

On the substrate of the semiconductor integrated circuit, a plurality of wires such as a signal line, a source wire and a ground wire are formed. The layout of wiring is determined by the auto placement and routing device. Each wire forms a capacitance between the substrate or the other wire and itself, called a wiring capacitance, as well as having an electrical resistance called a wiring resistance. When a signal is propagated through a signal line, a delay is caused according to a value determined by the product of the wiring resistance and the wiring capacitance of that signal line. If the wiring resistance is disregarded, the delay of the signal is determined by the wiring capacitance.

More specifically, the wiring capacitance equals to a total of a capacitance between the upper or bottom surface of the wire and the substrate (capacitance due to a plane component), a capacitance between the side surface of the wire and the substrate (fringe capacitance), and a capacitance between the adjacent wires (coupling capacitance).

In a semiconductor integrated circuit which was made before the design rule reached a submicron level, the capacitance between the wire and the substrate, especially, the capacitance due to a plane component, formed a large proportion of the wiring capacitance, while the coupling capacitance formed a small proportion thereof. In addition, since the potential of the substrate was unchanged, there was no necessity of considering that the amount of signal delay due to the wiring capacitance may fluctuate with a change in the potential of the substrate.

However, with recent downsizing of the semiconductor integrated circuit, the upper or bottom surface area of the wire becomes small and an interval between the adjacent wires is reduced. This reduces the proportion of the capacitance due to a plane component in the wiring capacitance, while increasing the proportion of the coupling capacitance. To be more specific, the proportion of the coupling capacitance in the whole wiring capacitance has increased to 50% or more. Further, while the potential of the substrate is unchanged, the potential of the wire, especially of the signal line, makes a transition according to the state of a propagated signal. Thus, with the potential transition of the signal line, there occur fluctuations in the amount of signal delay due to the coupling capacitance between that signal line and the adjacent signal line. When the potential transitions of the adjacent two signal lines take place at the same time but in different ways (for example, when the potential of one signal line makes a high to low transition while the potential of the other signal line makes a low to high transition), there arises a problem that the amount of signal delay due to the coupling capacitance between those signal lines is effectively increased.

The fluctuations in the amount of delay in the signal propagation through a signal line is, as previously described, caused by fluctuations in a potential difference between that signal line and the adjacent signal line. However, it can be also considered that the cause is an increase in the coupling capacitance between those signal lines due to the potential transition of the adjacent signal line. In the specification, the coupling capacitance considered with such an increase is referred to as an "effective coupling capacitance."

Next, timing of a signal transition will be described. In the present semiconductor integrated circuit, a signal propagated through each signal line, in most cases, makes a transition at a time when a reference signal (in general, a clock) makes a transition. The timing of each signal transition in relation to the timing of the clock transition can be considered as a matter of an attribute (signal attribute) of the signal line. For example, a signal line for propagating a signal that makes a transition at the same time that the clock makes a transition, is referred to as a "signal line having a signal attribute U," while a signal line for propagating a signal that makes a transition with a phase difference of a half cycle of the clock as compared with the timing of the clock transition, is referred to as a "signal line having a signal attribute V." In this way of thinking, the potential transitions of the signal lines each having a different signal attribute do not take place at the same time, while the potential transitions of the signal lines having the same signal attribute take place at the same time.

FIG. 17 schematically shows an example of a wiring layout by a conventional auto placement and routing device. For the simplicity of the description, only seven signal lines $102_1$ to $102_7$ are shown. Grids $101_1$ to $101_{13}$ are virtual wiring areas placed side by side on the substrate of the semiconductor integrated circuit. The auto placement and routing device allots the signal lines $102_1$ to $102_7$ to the grids $101_1$, $101_3$, $101_5$, $101_7$, $101_9$, $101_{11}$, and $101_{13}$, respectively. All the signal lines $102_1$ to $102_7$ have the same signal attribute A. Thus, on the substrate of the semiconductor integrated circuit, a plurality of signal lines $102_1$ to $102_7$ having the same signal attribute A are placed side by side.

FIG. 18 is a timing chart illustrating a state of each transition of signals propagated through the signal lines $102_1$ to $102_7$, respectively. Since the signal lines $102_1$ to $102_7$ have the same signal attribute A, all the signals propagated through those signal lines $102_1$ to $102_7$ make transitions at an observed time $T_{100}$. In this case, the signals propagated through the signal lines $102_1$ to $102_3$ and $102_5$ to $102_7$ make transitions from their low level (e.g., 0V) to their high level (e.g., 2.5 V), while the signal propagated through the signal line $102_4$ makes a high to low transition. With the signal transitions, the potentials of the signal lines $102_1$ to $102_7$ also make transitions.

Noting the signal lines $102_3$ and $102_4$, we will now describe fluctuations in the effective coupling capacitance accompanied by the potential transitions of the signal lines. As shown in FIG. 18, before the observed time $T_{100}$, the potential of the signal line $102_3$ was 0V and the potential of the signal line $102_4$ was 2.5 V. That is, a potential difference between those signal lines was 2.5 V. However, the potential transitions of the signal lines $102_3$ and $102_4$ from 0 to 2.5 V and from 2.5 to 0 V, respectively, at the observed time $T_{100}$ causes an apparent potential difference of 5 V therebetween. That is, at the moment of the potential transitions, the potential difference is increased to twice the value before the transitions. This doubles the effective coupling capacitance between the signal lines $102_3$ and $102_4$ as compared with the value before the potential transitions. Since the signal lines $102_3$ and $102_4$ are allotted at two grid intervals as shown in FIG. 17, an increase in the effective coupling capacitance accompanied by the potential transitions of those signal lines is expressed by C/2 where C is a coefficient of the coupling capacitance.

Since the signal lines $102_1$ to $102_7$ have the same signal attribute A as previously described, the signals propagated through the signal lines $102_1$ to $102_7$, respectively, make transitions at the same observed time $T_{100}$. Thus, the increase in the effective coupling capacitance accompanied by the potential transitions of the signal lines takes place not only between the signal lines $102_4$ and $102_3$ but also between the signal line $102_4$ and each of the other signal lines $102_1$, $102_2$, $102_5$, $102_6$, $102_7$. FIG. 19 shows such an increase in the effective coupling capacitance between the signal line $102_4$ and each of the other signal lines $102_1$ to $102_3$ and $102_5$ to $102_7$. In accordance with a grid interval between the signal line $102_4$ and each of the signal lines $102_1$ to $102_3$, $102_5$ to $102_7$, the effective coupling capacitances are increased by C/6 between the signal line $102_4$ and each of the signal lines $102_1$ and $102_7$, by C/4 between the signal line $102_4$ and each of the signal lines $102_2$ and $102_6$, and by C/2 between the signal line $102_4$ and each of the signal lines $102_3$ and $102_5$. Thus, the total increase in the effective coupling capacitances equals to C/6+C/4+C/2+C/2+C/4+C/6=11C/6.

In this manner, the conventional auto placement and routing device lays out wiring only with consideration for a reduction in the total wire length or a reduction in the wiring area. That is, no consideration is given for the increase in the effective coupling capacitance due to the potential transition of the adjacent wire.

FIG. 20 is a timing chart illustrating an increase in the amount of signal delay. This drawing corresponds to the extraction of waveforms of the signal lines $102_3$ to $102_5$ shown in FIG. 18. The increase in the effective coupling capacitance causes an overshoot 103 on the waveform of the signal line $102_4$. Thus, the signal transition through the signal line $102_4$ is delayed for a time D, as compared with the signal transitions through the signal lines $102_3$ and $102_5$. In this manner, the conventional auto placement and routing device has a problem that the increase in the effective coupling capacitance causes the increase in the amount of delay in the signal propagation through each signal line.

As the scale of the circuit increases, the wire length is necessarily increased and thus a load such as a parasitic capacitance and a parasitic resistance is increased. This becomes a drawback to high speed and high reliability of the semiconductor integrated circuit.

SUMMARY OF THE INVENTION

A first aspect of the present invention is directed to an auto placement and routing device. The device comprises: net list input means for inputting a net list that gives connection information as to a circuit which is formed by connecting elements by a plurality of wires including a plurality of signal lines; and layout data generation means for generating layout data with which each of the plurality of wires and each of the elements are allotted on a substrate to form the circuit. The net list includes information as to timing of each potential transition of the plurality of signal lines. The layout data generation means allots a wire the potential of which does not make a transition at a first time for a wire adjacent to one side of a first signal line the potential of which makes a transition at the first time, on the basis of the information as to timing in the net list.

According to a second aspect of the present invention, in the auto placement and routing device of the first aspect, the wire the potential of which does not make a transition at the first time is a second signal line the potential of which makes a transition at a second time that is different from the first time.

According to a third aspect of the present invention, in the auto placement and routing device of the second aspect, the layout data generation means allots a third signal line the potential of which makes a transition at the second time for a wire adjacent to the other side of the first signal line.

According to a fourth aspect of the present invention, in the auto placement and routing device of the second aspect, the layout data generation means allots a fourth signal line the potential of which makes a transition at the first time for a wire adjacent to the other side of the first signal line.

According to a fifth aspect of the present invention, in the auto placement and routing device of the fourth aspect, the layout data generation means sets an interval between the first signal line and the fourth signal line wider than an interval between the first signal line and the second signal line.

According to a sixth aspect of the present invention, in the auto placement and routing device of the first aspect, the wire the potential of which does not make a transition at the first time is either a source wire or a ground wire.

According to a seventh aspect of the present invention, in the auto placement and routing device of the sixth aspect, the layout data generation means allots either a source wire or a ground wire for a wire adjacent to the other side of the first signal line.

According to an eighth aspect of the present invention, in the auto placement and routing device of the sixth aspect, the layout data generation means allots a fifth signal line the potential of which makes a transition at the first time or at a second time that is different from the first time, for a wire adjacent to the other side of the first signal line. The layout data generation means further sets an interval between the first signal line and the fifth signal line wider than an interval between the first signal line and either the source wire or the ground wire.

According to a ninth aspect of the present invention, in the auto placement and routing device of the sixth aspect, the net list includes information as to delays in the signal propagation through each of the plurality of signal lines, and the layout data generation means sets one of the plurality of signal lines that is especially susceptible to influences of signal delay, as the first signal, on the basis of the information as to signal delay.

According to a tenth aspect of the present invention, in the auto placement and routing device of the first aspect, each potential of the plurality of signal lines makes a transition in synchronization with the transition of a reference signal, and the information as to timing in the net list includes a tolerable time difference in the potential transitions between the reference signal and each of the plurality of signal lines.

An eleventh aspect of the present invention is directed to a semiconductor integrated circuit comprising a plurality of wires placed side by side. The plurality of wires including a first signal line the potential of which makes a transition at a first time. A wire adjacent to one side of the first signal line is a wire the potential of which does not make a transition at the first time.

According to a twelfth aspect of the present invention, in the semiconductor integrated circuit of the eleventh aspect, the wire the potential of which does not make a transition at the first time is a second signal line the potential of which makes a transition at a second time that is different from the first time.

According to a thirteenth aspect of the present invention, in the semiconductor integrated circuit of the twelfth aspect, a wire adjacent to the other side of the first signal line is a third signal line the potential of which makes a transition at the second time.

According to a fourteenth aspect of the present invention, in the semiconductor integrated circuit of the twelfth aspect, a wire adjacent to the other side of the first signal line is a fourth signal line the potential of which makes a transition at the first time.

According to a fifteenth aspect of the present invention, in the semiconductor integrated circuit of the fourteenth aspect, an interval between the first signal line and the fourth signal line is wider than an interval between the first signal line and the second signal line.

According to a sixteenth aspect of the present invention, in the semiconductor integrated circuit of the eleventh aspect, the wire the potential of which does not make a transition at the first time is either a source wire or a ground wire.

According to a seventeenth aspect of the present invention, in the semiconductor integrated circuit of the sixteenth aspect, a wire adjacent to the other side of the first signal line is either a source wire or a ground wire.

According to an eighteenth aspect of the present invention, in the semiconductor integrated circuit of the sixteenth aspect, a wire adjacent to the other side of the first signal line is a fifth signal line the potential of which makes a transition at the first time or at a second time that is different from the first time, and an interval between the first signal line and the fifth signal line is wider than an interval between the first signal line and either the source wire or the ground wire.

According to a nineteenth aspect of the present invention, in the semiconductor integrated circuit of the sixteenth aspect, the first signal line is one of the plurality of signal lines that is especially susceptible to influences of signal delay.

In the device of the first aspect, the potential transition of the wire adjacent to the other side of the first signal line does not take place at the first time when the potential transition of the first signal line takes place. This prevents, at the first time, an increase in the coupling capacitance between the first signal line and the wire due to the potential transition of that wire.

In the device of the second aspect, while the potential transition of the first signal line takes place at the first time, the potential transition of the second signal line adjacent to one side of the first signal takes place at the second time. This prevents, at the first time, an increase in the coupling capacitance between the first signal line and the second signal line due to the potential transition of the second signal line.

In the device of the third aspect, while the potential transition of the first signal line takes place at the first time, the potential transition of the third signal line adjacent to the other side of the first signal takes place at the second time. This prevents, at the first time, an increase in the coupling capacitance between the first signal line and the third signal line due to the potential transition of the third signal line.

In the device of the fourth aspect, the potential transition of the fourth signal line which is adjacent to the other side of the first signal line takes place at the first time as the potential transition of the first signal line. This prevents, at the second time, an increase in the coupling capacitance between the first signal line and the fourth signal line due to the potential transition of the fourth signal line.

In the device of the fifth aspect, the layout data generation means sets the interval between the first signal line and the fourth signal line the potentials of which make transitions at the first time, wider than the interval between the first signal line and the second signal line the potentials of which make transitions at different times. This relieves, at the first time, an increase in the coupling capacitance between the first signal line and the fourth signal line due to the potential transition of the fourth signal line.

In the device of the sixth aspect, the layout data generation means allots either the source wire or the ground wire for a wire adjacent to one side of the first signal line. Since the potential of the source wire or the ground wire does not make a transition, there occurs no fluctuation in the coupling capacitance between the first signal line and either the ground wire or the source wire.

In the device of the seventh aspect, the layout data generation means allots either the source wire or the ground wire not only for a wire adjacent to one side of the first signal line but also for a wire adjacent to the other side of the first signal line. Thus, the first signal line is sandwiched between the source wires or the ground wires. This prevents fluctuations in the coupling capacitance.

In the device of the eighth aspect, the layout data generation means sets the interval between the first signal line and the fifth signal line wider than the interval between the first signal line and either the source wire or the ground wire. This relieves an increase in the coupling capacitance between the first signal line and the fifth signal line due to the potential transition of the fifth signal line.

In the device of the ninth aspect, the layout data generation means sets one of the plurality of signal lines that is especially susceptible to influences of signal delay, as a first signal line. Then, an increase in the coupling capacitance of that signal line is appropriately reduced by the invention according to the sixth aspect. This appropriately suppresses a delay in the signal propagation through that signal line.

In the device of the tenth aspect, when the time difference in the potential transitions between the reference signal and the signal line is within a tolerable range, the layout data generation means can generate layout data, regarding the potential transition of that signal line as being synchronized with the transition of the reference signal. This indicates that the invention according to the first aspect is applicable to the actual form.

In the circuit of the eleventh aspect, the potential transition of the wire adjacent to one side of the first signal line does not take place at the first time when the potential transition of the first signal line takes place. This prevents, at the first time, an increase in the coupling capacitance between the first signal line and that wire due to the potential transition of that wire.

In the circuit of the twelfth aspect, while the potential transition of the first signal line takes place at the first time, the potential transition of the second signal adjacent to one side of the fist signal line takes place at the second time. This prevents, at the second time, an increase in the coupling capacitance between the first signal line and the second signal line due to the potential transition of the second signal line.

In the circuit of the thirteenth aspect, while the potential transition of the first signal line takes place at the first time, the potential transition of the third signal line adjacent to the other side of the first signal line takes place at the second time. This prevents, at the first time, an increase in the coupling capacitance between the first signal line and the third signal line due to the potential transition of the third signal line.

In the circuit of the fourteenth aspect, the potential transition of the fourth signal line adjacent to the other side of the first signal line takes place at the first time as the potential transition of the first signal line. This prevents, at the second time, an increase in the coupling capacitance between the first signal line and the fourth signal line due to the potential transition of the fourth signal line.

In the circuit of the fifteenth aspect, the interval between the first signal line and the fourth signal line the potentials of which make transitions at the first time, is wider than the interval between the first signal line and the second line the potentials of which make transitions at different times. This relieves, at the first time, an increase in the coupling capacitance between the first signal line and the fourth signal line due to the potential transition of the fourth signal line.

In the circuit of the sixteenth aspect, the first signal line is adjacent to either the source wire or the ground wire. Since the potential of the source wire or the ground wire does not make a transition, there occurs no fluctuation in the coupling capacitance between the first signal line and either the source wire or the ground wire.

In the circuit of the seventeenth aspect, the first signal line is sandwiched between the source wires or the ground wires. This prevents fluctuations in the coupling capacitance.

In the circuit of the eighteenth aspect, the interval between the first signal line and the fifth signal line is wider than the interval between the first signal line and either the source wire or the ground wire. This relieves an increase in the coupling capacitance between the first signal line and the fifth signal line due to the potential transition of the fifth signal line.

In the circuit of the nineteenth aspect, one of the plurality of signal lines that is especially susceptible to influences of signal delay is adopted as the first signal line.

Thus, an increase in the coupling capacitance of that signal line is reduced by the invention according to the sixteenth aspect. This appropriately suppresses a delay in the signal propagation through that signal line.

An object of the present invention is to provide an auto placement and routing device for laying out wiring with consideration for influences of the increase in the effective coupling capacitance, and to obtain a semiconductor integrated circuit suitable for high speed and high reliability by laying out the wiring by the auto placement and routing device.

These and other objects, features, aspects and advantages of the present invention will become more apparent from the following detailed description of the present invention when taken in conjunction with the accompanying drawings.

DESCRIPTION OF THE PREFERRED EMBODIMENTS

As previously discussed with the conventional technique, a general logic circuit starts operation at the transition of a reference signal (e.g., a clock in a synchronous circuit or a ready signal in an asynchronous circuit). When considering a load connected to each signal line, for example, we can predict how long the transition of a signal propagated through each signal line is delayed from the transition of the reference signal, during a design stage. For instance, a logic circuit forming a synchronous circuit (e.g., a latch circuit or a combinational circuit) starts operation roughly in synchronization with a rising edge of the clock. Even if the circuit is not in perfect synchronization with the rising edge of the clock, it is possible to predict how long the operation of the circuit is delayed from the rising edge of the clock. A logic circuit forming an asynchronous circuit, on the other hand, starts operation roughly at a rising edge of the ready signal. As is the case with the synchronous circuit, it is possible to predict how long the operation of the circuit is delayed from the rising edge of the ready signal. The point of the present invention is to lay out wiring (to determine an order or an interval of wires) on the basis of such information. The following description gives concrete preferred embodiments of the present invention.

1. First Preferred Embodiment

Figure 1:
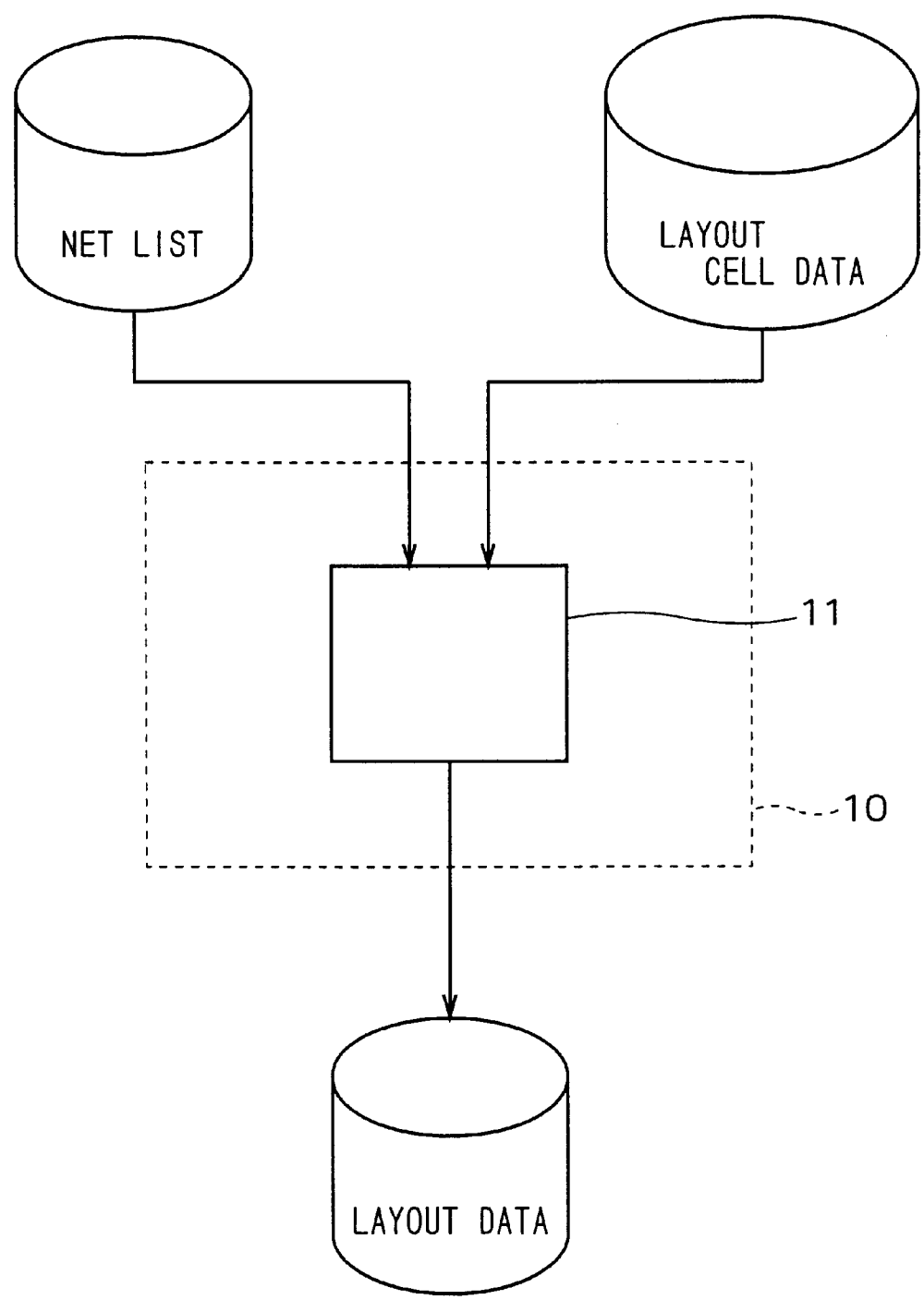
FIG. 1 is a schematic block diagram of the structure of an auto placement and routing device according to a first preferred embodiment of the present invention.

FIG. 1 is a block diagram schematically showing the structure of an auto placement and routing device according to a first preferred embodiment of the present invention. An auto placement and routing device 10 comprises a layout data generation unit 11. The layout data generation unit 11 inputs a net list (connection information as to a circuit) and layout cell data from the outside, and referring to this data, generates and outputs layout data as to wiring or a cell. An object wire to be laid out includes a signal line, a source wire, a ground wire, and so on. The net list includes information as to timing of the potential transition of each signal line. To be more specific, the information includes, apart from a signal attribute of each signal line, collateral information such as an estimate wire length and an actual wire length, an estimate wiring capacitance and an actual wiring capacitance, an actual wiring resistance, and detailed timing information as to signal transition (e.g., a delay in the rising time of a signal waveform as compared with the rising time of the clock).

Figure 2:
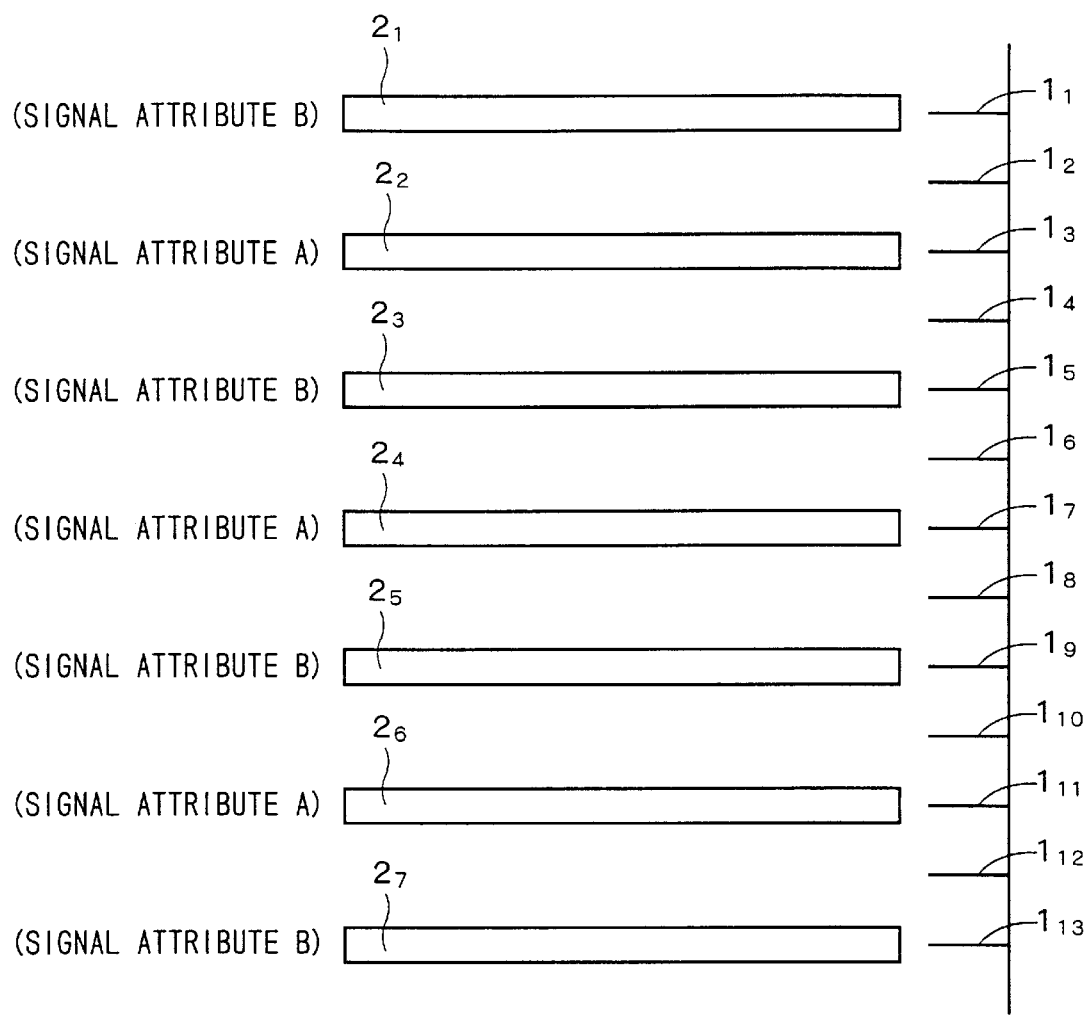
FIG. 2 schematically shows a wiring layout by the auto placement and routing device.

FIG. 2 schematically shows a wiring layout by the auto placement and routing device 10. For the simplicity of the description, only seven signal lines $2_1$ to $2_7$ are shown. Grids $1_1$ to $1_{13}$ are virtual wiring areas placed side by side on the substrate of a semiconductor integrated circuit. On the basis of the layout data outputted from the auto placement and routing device 10, a predetermined wire is allotted to each grid. In this first preferred embodiment, the signal lines $2_1$ to $2_7$ are allotted to the grids $1_1$, $1_3$, $1_5$, $1_7$, $1_9$, $1_{11}$, $1_{13}$, respectively. The signal lines $2_1$, $2_3$, $2_5$, and $2_7$ have a signal attribute B, while the signal lines $2_2$, $2_4$ and $2_6$ have a signal attribute A. At this time, "the signal line having the signal attribute A" indicates a signal line for propagating a signal that makes a transition at an observed time $T_1$ to be described later, while "the signal line having the signal attribute B" indicates a signal line for propagating a signal that makes a transition at an observed time $T_2$ to be described later. Thus, the signal line having the signal attribute A and the signal line having the signal attribute B are placed by turns so that the signal lines having the same signal attribute are not to be adjacent to each other.

Figure 3:
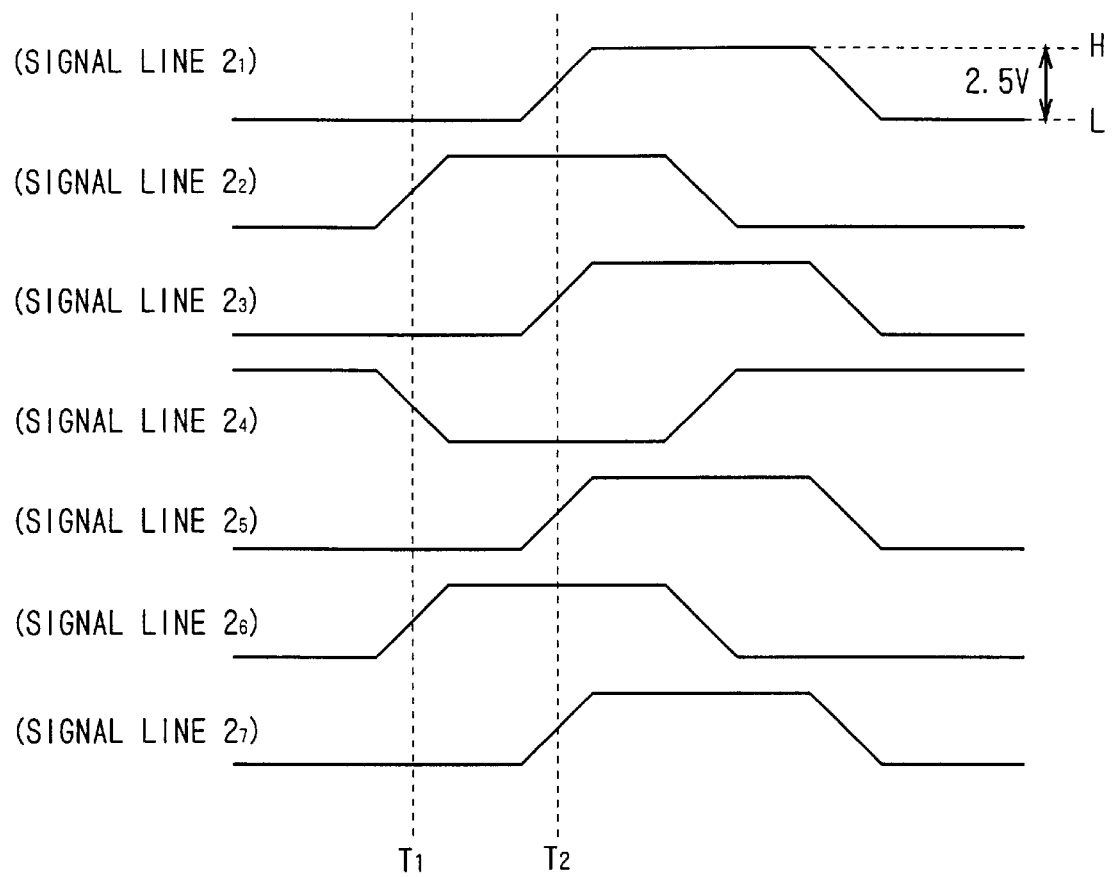
FIG. 3 is a timing chart illustrating a state of each transition of signals propagated through a plurality of signal lines, respectively.

FIG. 3 is a timing chart illustrating a state of each transition of signals propagated through the signal lines $2_1$ to $2_7$, respectively. Although a clock is not shown in FIG. 3, the observed time $T_1$ is, for example, a rising time of the clock, while the observed time $T_2$ is, for example, a falling time of the clock. The transitions of the signals propagated through the signal lines $2_1$ to $2_7$ are in perfect synchronization with the clock transition.

Since the signal lines $2_2$, $2_4$, and $2_6$ have the signal attribute A, the signals propagated through these signal lines make transitions at the observed time $T_1$. More specifically, at the observed time $T_1$, each of the signals propagated through the signal lines $2_2$ and $2_6$ makes a low to high transition, while the signal propagated through the signal line $2_4$ makes a high to low transition. On the other hand, the signal lines $2_1$, $2_3$, $2_5$, and $2_7$ have the signal attribute B. Thus, the signals propagated through these signal lines make transitions at the observed time $T_2$. More specifically, at the observed time $T_2$, each of the signals propagated through the signal lines $2_1$, $2_3$, $2_5$ and $2_7$ makes a low to high transition. Here, in accordance with the level of a signal propagated through each signal line, the potential of each signal line also makes a transition. In this case, the potential of the signal line is 0 V at a low signal level, while 2.5 V at a high signal level.

Regarding the signal line $2_4$ as an observed signal line, we will now consider how the effective coupling capacitance between the signal line $2_4$ and each of the other signal lines fluctuates accompanied by the potential transition of each signal line.

Figure 4:
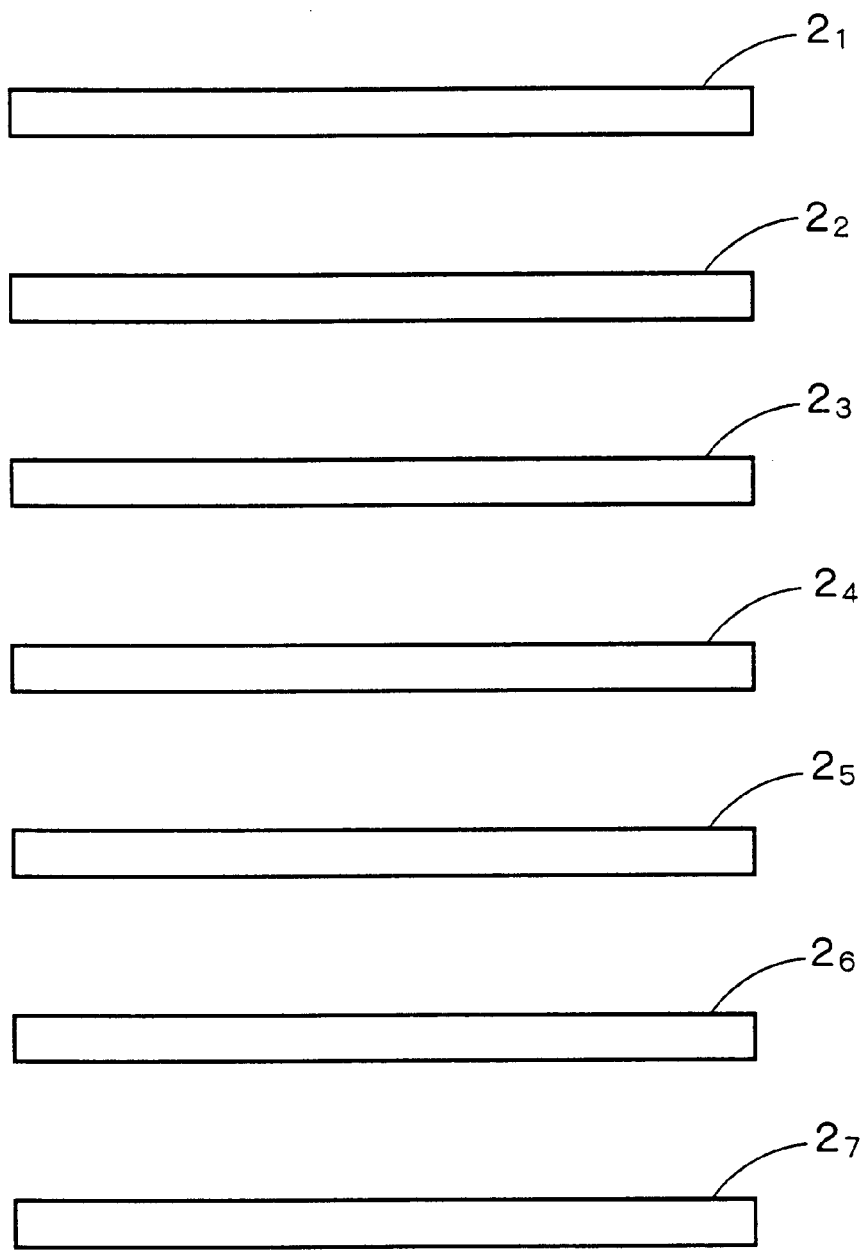
FIG. 4 shows fluctuations in effective coupling capacitances at a time $T_1$.

FIG. 4 shows fluctuations in the effective coupling capacitances at the observed time $T_1$. As shown in FIG. 3, at the observed time $T_1$, neither the signals propagated through the signal lines $2_3$ and $2_5$ adjacent to the signal line $2_4$ make transitions. Thus, as shown in FIG. 4, the increase in the effective coupling capacitance between the signal line $2_4$ and each of the other signal lines is zero at the observed time $T_1$. At the time $T_1$, while each of the signals propagated through the signal lines $2_2$ and $2_6$ makes a low to high transition, neither the signal propagated through the signal line $2_3$ between the signal lines $2_4$ and $2_2$ nor the signal propagated through the signal line $2_5$ between the signal lines $2_4$ and $2_6$ make transitions. Thus, the effective coupling capacitances between the signal line $2_4$ and the signal lines $2_2$, $2_6$ are not affected by the potential transitions of the signal lines $2_2$ and $2_6$.

Figure 5:
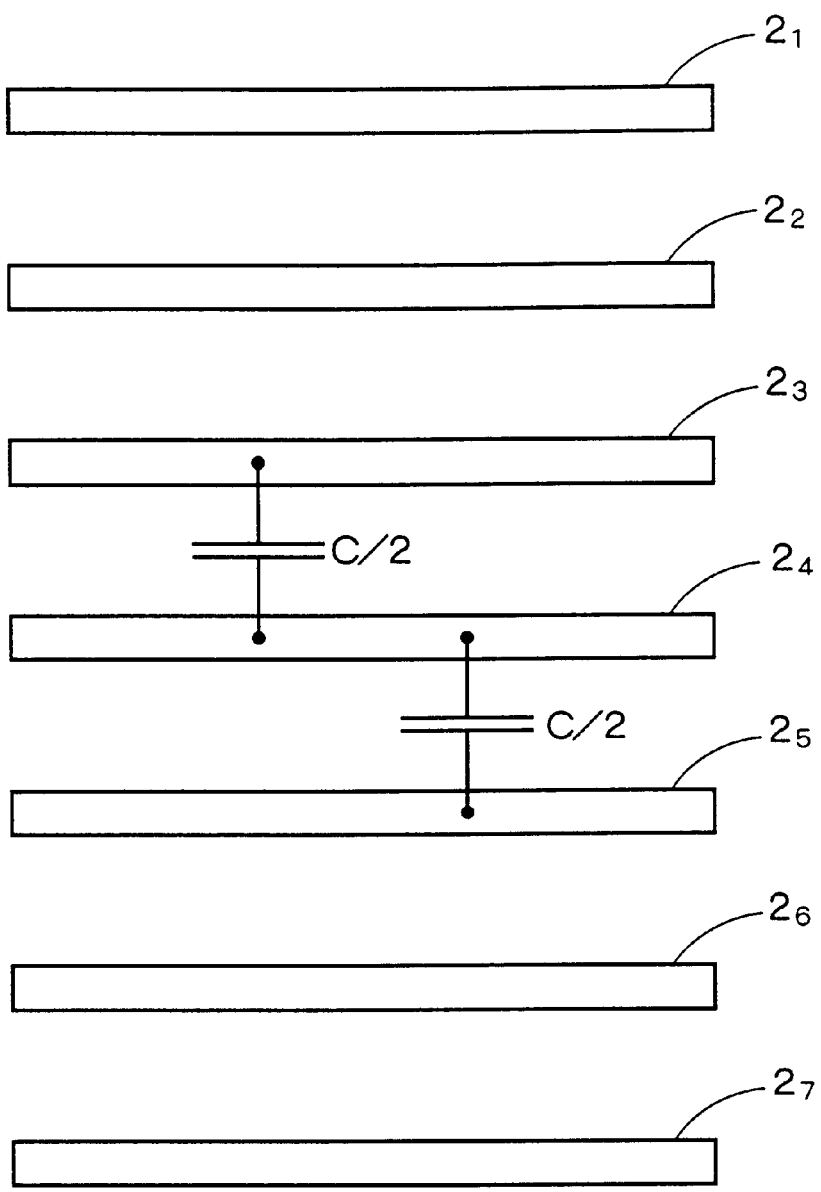
FIG. 5 shows fluctuations in the effective coupling capacitances at a time $T_2$.

FIG. 5 shows fluctuations in the effective coupling capacitances at the observed time $T_2$. As shown in FIG. 3, at the observed time $T_2$, each of the signals propagated through the signal lines $2_3$ and $2_5$ adjacent to the signal line $2_4$ makes a low to high transition. Thus, with consideration for an interval of two grids between each signal line, the effective coupling capacitance between the signal line $2_4$ and each of the signal lines $2_3$, $2_5$ is increased by C/2 at the observed time $T_2$ as shown in FIG. 5. Consequently, the total increase in the effective coupling capacitances equals to C/2+C/2=C. This indicates that, even if the potential transition of the signal line $2_4$ does not take place, the potential transitions of the adjacent signal lines $2_3$ and $2_5$ increase the effective coupling capacitances between the signal line $2_4$ and the signal lines $2_3$, $2_5$. At the observed time $T_2$, while each of the signals propagated through the signal lines $2_1$ and $2_7$ also makes a low to high transition, neither the signal propagated through the signal line $2_2$ between the signal lines $2_4$ and $2_1$ nor the signal propagated through the signal line $2_6$ between the signal lines $2_4$ and $2_7$ make transitions. Thus, the effective coupling capacitances between the signal line $2_4$ and the signal lines $2_1$, $2_7$ are not affected by the potential transitions of the signal lines $2_1$ and $2_7$.

In this manner, the auto placement and routing device according to the first preferred embodiment lays out wiring so that the signal line having the signal attribute A and the signal line having the signal attribute B are placed by turns. This makes the signal attributes of the observed signal line and of the adjacent signal lines different from each other. Accordingly, the potential transitions of the adjacent signal lines do not take place at a time when the potential transition of the observed signal line takes place. Thus, the increase in the effective coupling capacitance of the observed signal line due to the potential transitions of the adjacent signal lines can be reduced to zero.

Further, the semiconductor integrated circuit having the wiring laid out by the auto placement and routing device according to the first preferred embodiment can reduce the amount of delay in the signal propagation through the observed signal line, since the increase in the effective coupling capacitance at the potential transition of the observed signal line is reduced to zero. This achieves the semiconductor integrated circuit suitable for high speed and high reliability.

2. Second Preferred Embodiment

An auto placement and routing device according to a second preferred embodiment of the present invention has a similar structure to that of the first preferred embodiment shown in FIG. 1.

Figure 6:
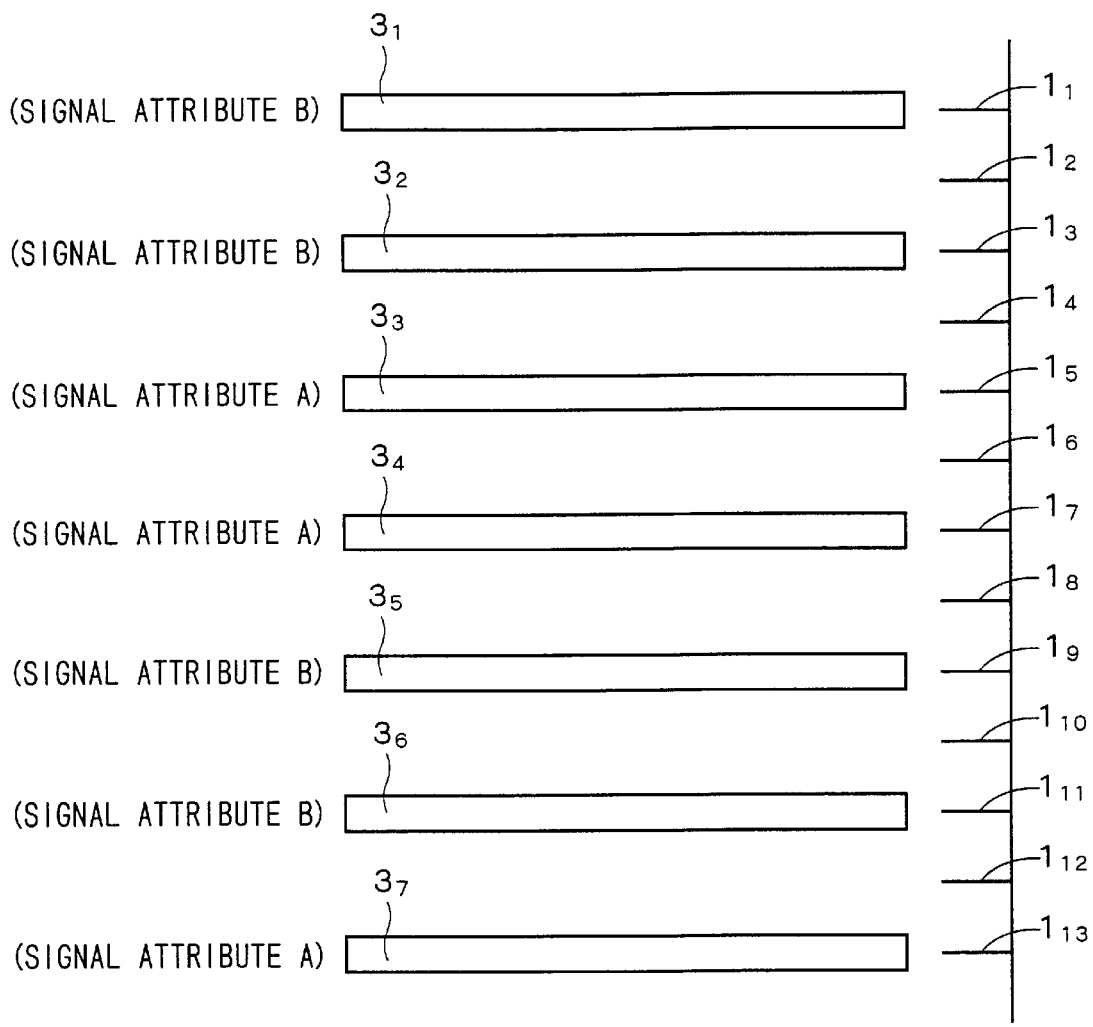
FIG. 6 schematically shows a wiring layout by an auto placement and routing device according to a second preferred embodiment of the present invention.

FIG. 6 schematically shows a wiring layout by the auto placement and routing device 10 according to the second preferred embodiment. For the simplicity of the description, only seven signal lines $3_1$ to $3_7$ are shown. In this second preferred embodiment, the signal lines $3_1$ to $3_7$ are allotted to the grids $1_1, 1_3, 1_5, 1_7, 1_9, 1_{11}$, and $1_{13}$, respectively. The signal lines $3_1, 3_2, 3_5$, and $3_6$ have the signal attribute B, and the signal lines $3_3, 3_4$, and $3_7$ have the signal attribute A. Accordingly, a pair of signal lines having the signal attribute A and a pair of signal lines having the signal attribute B are placed by turns so that each signal line is, at its one side, adjacent to a signal line having the same signal attribute while, at its other side, adjacent to a signal line having a different signal attribute.

Figure 7:
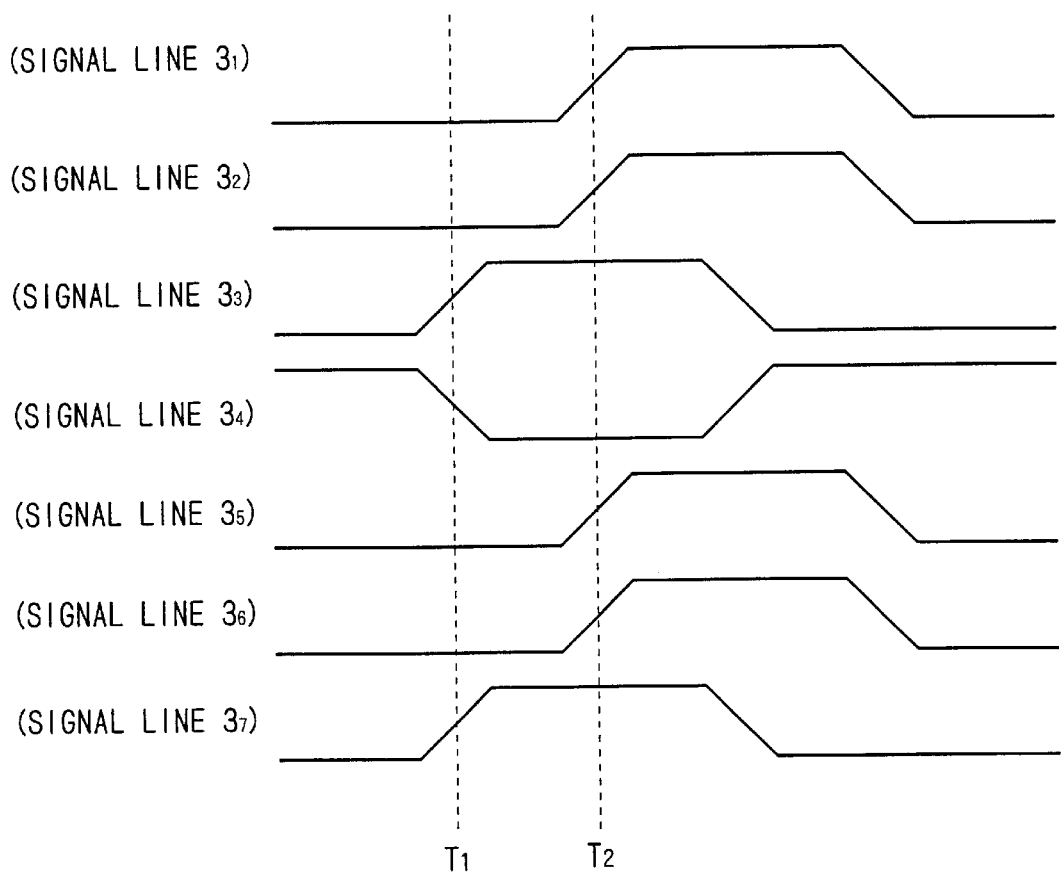
FIG. 7 is a timing chart illustrating a state of each transition of signals propagated through a plurality of signal lines, respectively

FIG. 7 is a timing chart illustrating a state of each transition of signals propagated through the signal lines $3_1$ to $3_7$, respectively. Since the signal lines $3_3, 3_4$, and $3_7$ have the same signal attribute A, the signals propagated through those signal lines make transitions at the observed time $T_1$. More specifically, at the observed time $T_1$, each of the signals propagated through the signal lines $3_3$ and $3_7$ makes a low to high transition, while the signal propagated through the signal line $3_4$ makes a high to low transition. On the other hand, since the signal lines $3_1, 3_2, 3_5$, and $3_6$ have the same signal attribute B. Thus, the signals propagated through those signal lines make transitions at the observed time $T_2$. More specifically, at the observed time $T_2$, each of the signals propagated through the signal lines $3_1, 3_2, 3_5$, and $3_6$ makes a low to high transition.

Regarding the signal line $3_4$ as an observed signal line, we will now consider how the effective coupling capacitance between the signal line $3_4$ and each of the other signal lines fluctuates accompanied by the potential transition of each signal line.

Figure 8:
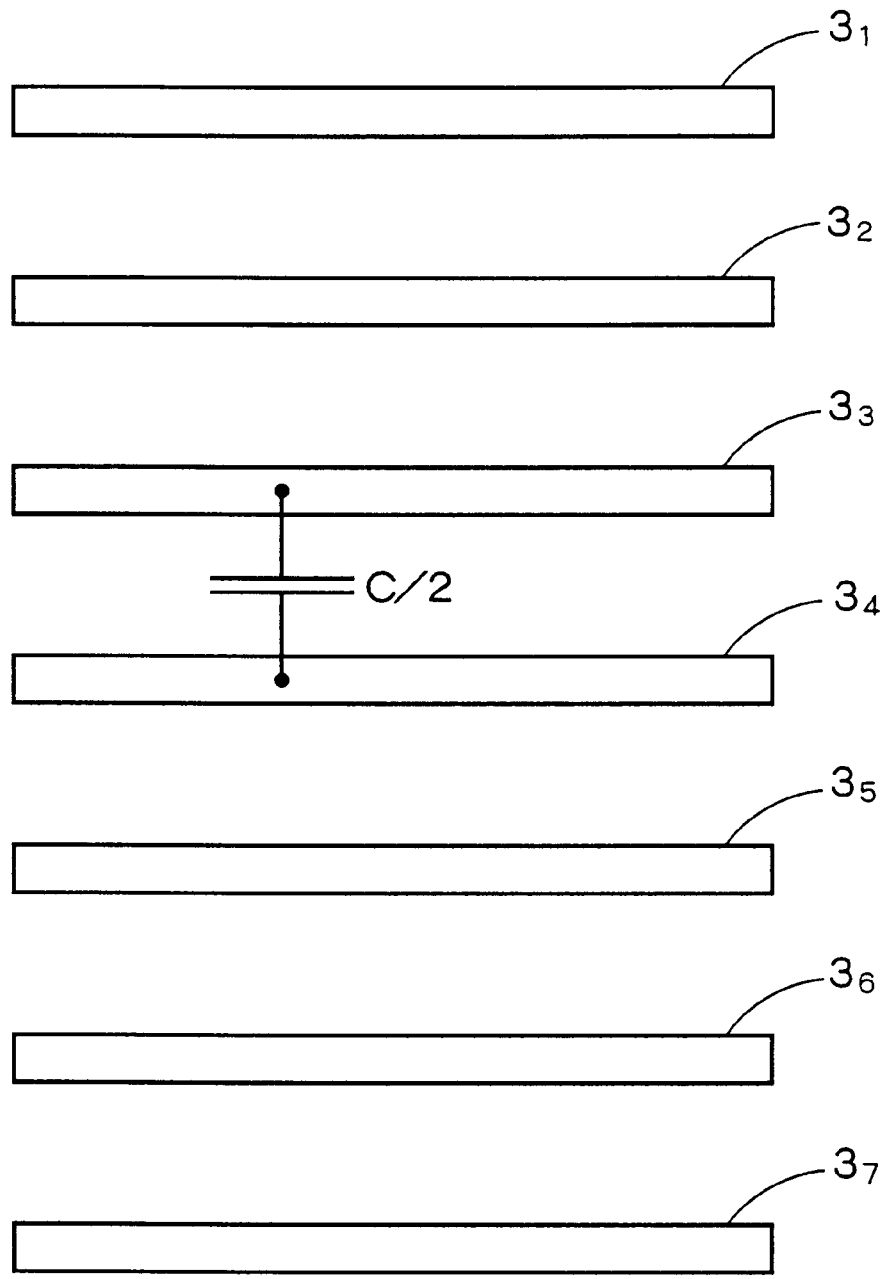
FIG. 8 shows fluctuations in the effective coupling capacitances at the time $T_1$.

FIG. 8 shows fluctuations in the effective coupling capacitances at the observed time $T_1$. As shown in FIG. 7, at the observed time $T_1$, while the signal propagated through the signal line $3_4$ makes a high to low transition, the signal propagated through the signal line $3_3$ adjacent to the signal line $3_4$ makes a low to high transition. Thus, with consideration for an interval of two grids between each signal line, the effective coupling capacitance between the signal lines $3_4$ and $3_3$ is increased by $C/2$ at the observed time $T_1$, as shown in FIG. 8. That is, the increase in the effective coupling capacitance at the observed time $T_1$ is reduced by 73% as compared with that of the conventional technique. At the time $T_1$, while the signal propagated through the signal line $3_7$ also makes a low to high transition, neither the signals propagated through the signal lines $3_5$ and $3_6$ between the signal lines $3_4$ and $3_7$ make transitions. Thus, the effective coupling capacitance between the signal lines $3_4$ and $3_7$ is not affected by the potential transition of the signal line $3_7$.

Figure 9:
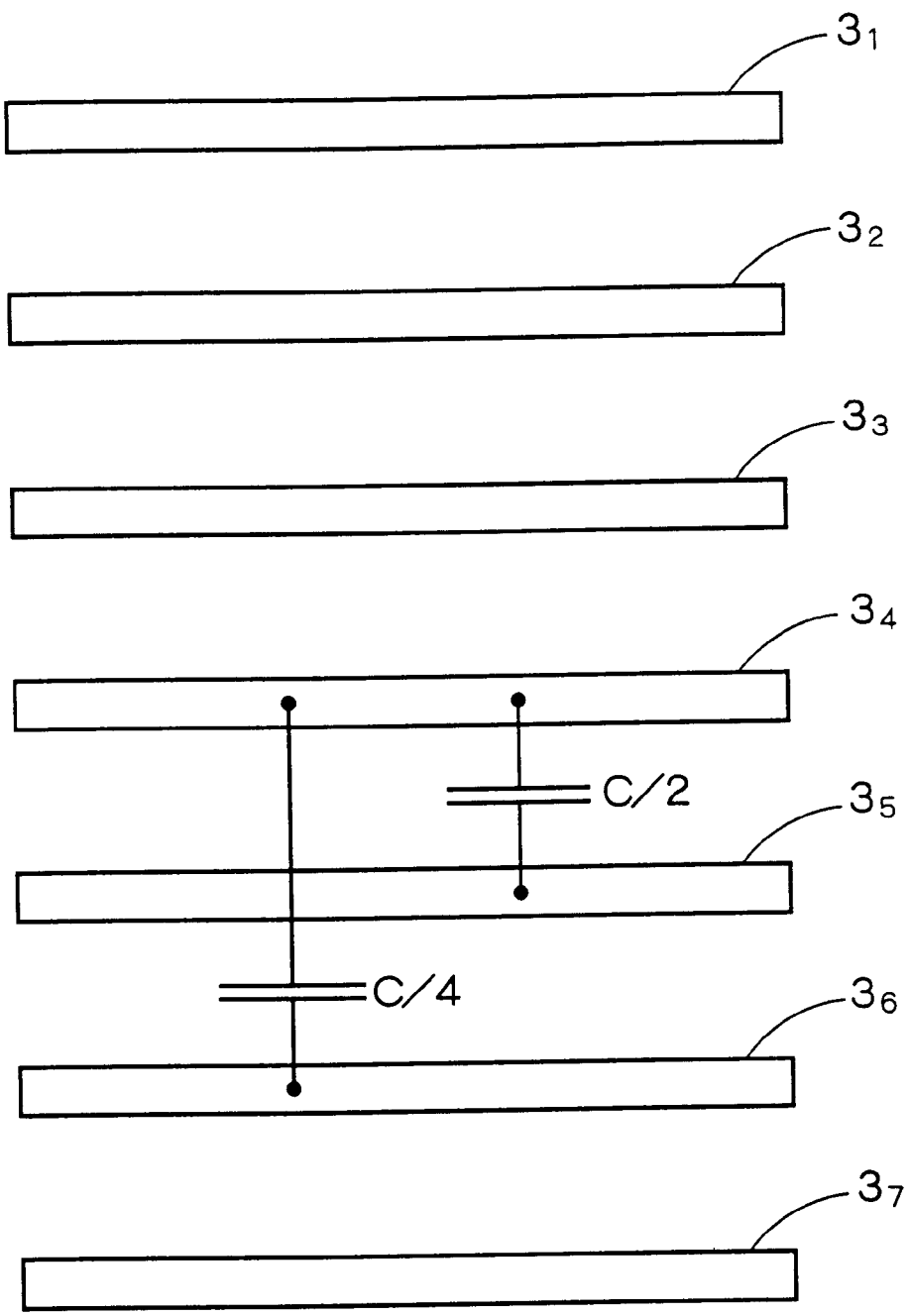
FIG. 9 shows fluctuations in the effective coupling capacitances at the time $T_2$.

FIG. 9 shows fluctuations in the effective coupling capacitances at the observed time $T_2$. As shown in FIG. 7, at the observed time $T_2$, each of the signal propagated through the signal line $3_5$ adjacent to the signal line $3_4$ and the signal propagated through the signal line $3_6$ adjacent to the signal line $3_5$ on the other side of the signal line $3_4$ makes a low to high transition. Thus, with consideration of an interval of two grids between each signal line, the effective coupling capacitance between the signal line $3_4$ and $3_5$ is increased by $C/2$, and the effective coupling capacitance between the signal lines $3_4$ and $3_6$ is increased by $C/4$ at the observed time $T_2$ as shown in FIG. 9. Consequently, the total increase in the effective coupling capacitances equals to $C/2+C/4=3C/4$. That is, the increase in the effective coupling capacitances at the observed time $T_2$ is reduced by 25% as compared with the first preferred embodiment. At the observed time $T_2$, while each of the signals propagated through the signal lines $3_1$ and $3_2$ also makes a low to high transition, the signals propagated through the signal line $3_3$ between the signal line $3_4$ and the signal lines $3_1$ and $3_2$ do not make transitions. Thus, the effective coupling capacitances between the signal line $3_4$ and the signal lines $3_1, 3_2$ are not affected by the potential transitions of the signal lines $3_1$ and $3_2$.

In this manner, the auto placement and routing device according to the second preferred embodiment lays out wiring so that a pair of signal lines having the signal attribute A and a pair of signal lines having the signal attribute B are placed by turns. Thus, the observed signal line is, at its one side, adjacent to a signal line having the same signal attribute while, at its other side, adjacent to a signal line having a different signal attribute. Accordingly, the potential transition of the adjacent signal line having a different signal attribute does not take place at a time when the potential transition of the observed signal line takes place. This reduces the increase in the effective coupling capacitance of the observed signal line due to the potential transition of the signal line adjacent to the other side of the observed signal line.

Further, the semiconductor integrated circuit having the wiring laid out by the auto placement and routing device according to the second preferred embodiment can reduce the amount of delay in the signal propagation through the observed signal line, since the increase in the effective coupling capacitance at the potential transition of the observed signal line is reduced. This achieves the semiconductor integrated circuit suitable for high speed and high reliability.

3. Third Preferred Embodiment

An auto placement and routing device according to a third preferred embodiment of the present invention has a similar structure to that of the first preferred embodiment shown in FIG. 1.

Figure 10:
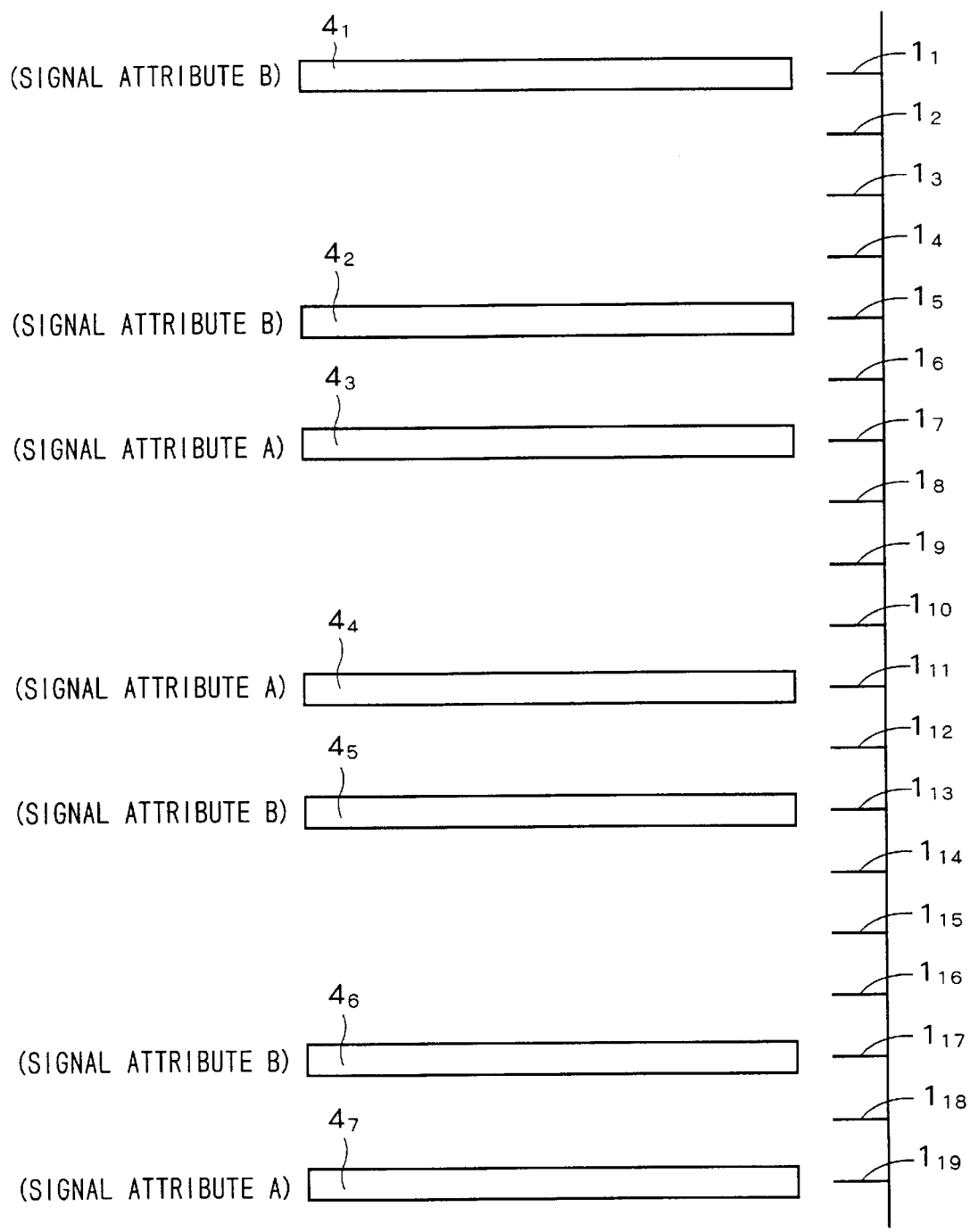
FIG. 10 schematically shows a wiring layout by an auto placement and routing device according to a third preferred embodiment.

FIG. 10 schematically shows a wiring layout by the auto placement and routing device 10 according to the third preferred embodiment. For the simplicity of the description, only seven signal lines $4_1$ to $4_7$ are shown. In this third preferred embodiment, the signal lines $4_1$ to $4_7$ are allotted to the grids $1_1, 1_5, 1_7, 1_{11}, 1_{13}, 1_{17}$, and $1_{19}$, respectively. The signal lines $4_1, 4_2, 4_5$, and $4_6$ have the signal attribute B, and the signal lines $4_3, 4_4$, and $4_7$ have the signal attribute A. Thus, as in the second preferred embodiment, a pair of signal lines having the signal attribute A and a pair of signal lines having the signal attribute B are placed by turns so that each signal line is, at its one side, adjacent to a signal line having the same signal attribute while, at its other side, adjacent to a signal line having a different signal attribute.

A timing chart of a state of each transition of signals propagated through the signal lines $4_1$ to $4_7$ is similar to that of the second preferred embodiment shown in FIG. 7. That is, at the observed time $T_1$, each of the signals propagated through the signal lines $4_3$ and $4_7$ makes a low to high transition, while the signal propagated through the signal line $4_4$ makes a high to low transition. At the observed time $T_2$, on the other hand, each of the signals propagated through the signal lines $4_1, 4_2, 4_5$, and $4_6$ makes a low to high transition.

Regarding the signal line $4_4$ as an observed signal line, we will now consider how the effective coupling capacitance between the signal line $4_4$ and each of the other signal lines fluctuates accompanied by the potential transition of each signal line.

Figure 11:
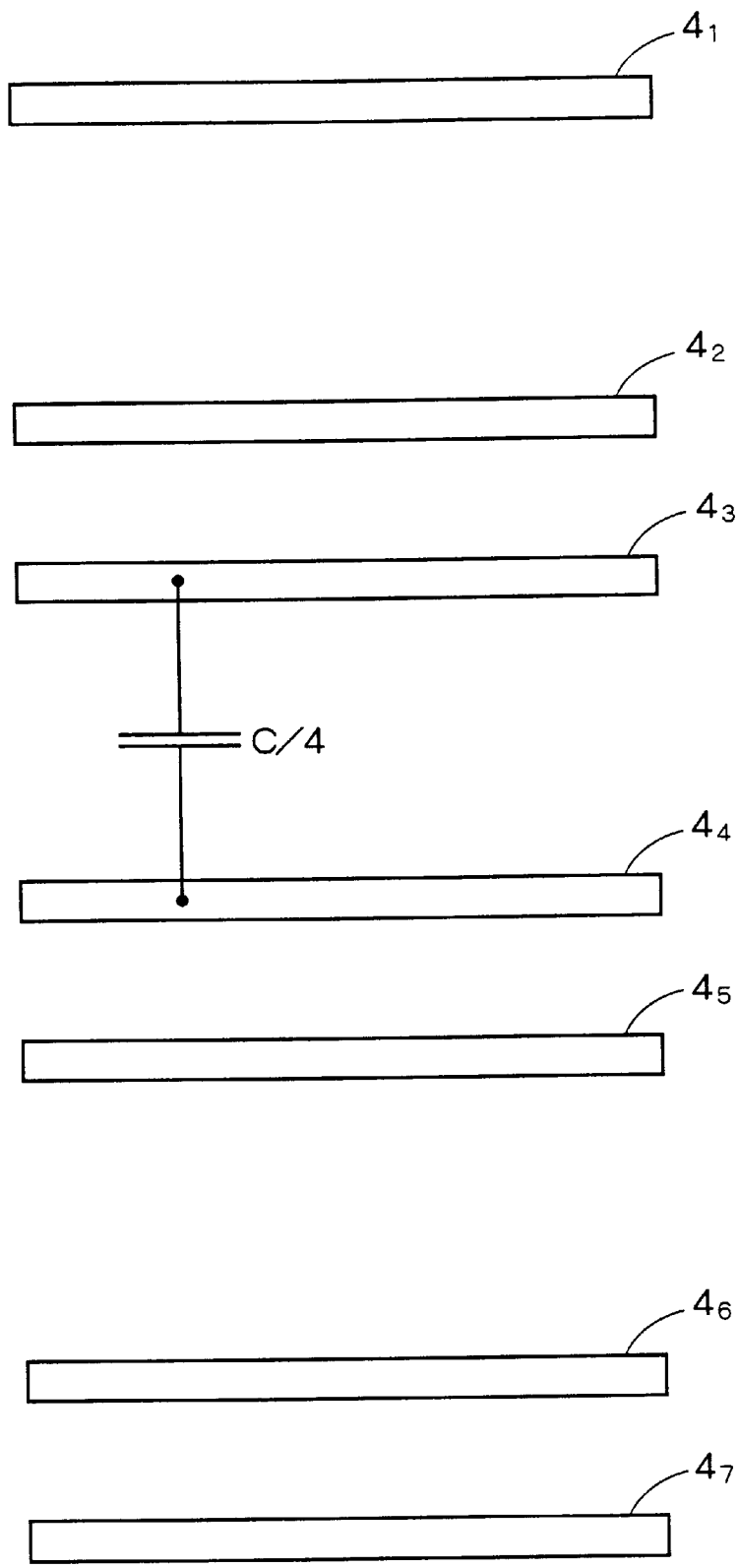
FIG. 11 shows fluctuations in the effective coupling capacitances at the time $T_1$.

FIG. 11 shows fluctuations in the effective coupling capacitances at the observed time $T_1$. As previously described, at the observed time $T_1$, the signal propagated through the signal line $4_4$ makes a high to low transition, and the signal propagated through the signal line $4_3$ adjacent to the signal line $4_4$ makes a low to high transition. Thus, with consideration for an interval of four grids between the signal lines $4_4$ and $4_3$, the effective coupling capacitance between the signal line $4_4$ and $4_3$ is increased by C/4 at the observed time $T_1$, as shown in FIG. 11. That is, the increase in the effective coupling capacitances at the observed time $T_1$ is reduced by 86% as compared with that of the conventional technique and reduced by 50% as compared with that of the second preferred embodiment. At the time $T_1$, while the signal propagated through the signal line $4_7$ also makes a low to high transition, neither the signals propagated through the signal lines $4_5$ and $4_6$ between the signal lines $4_4$ and $4_7$ make transitions. Thus, the effective coupling capacitance between the signal lines $4_4$ and $4_7$ is not affected by the potential transition of the signal line $4_7$.

Figure 12:
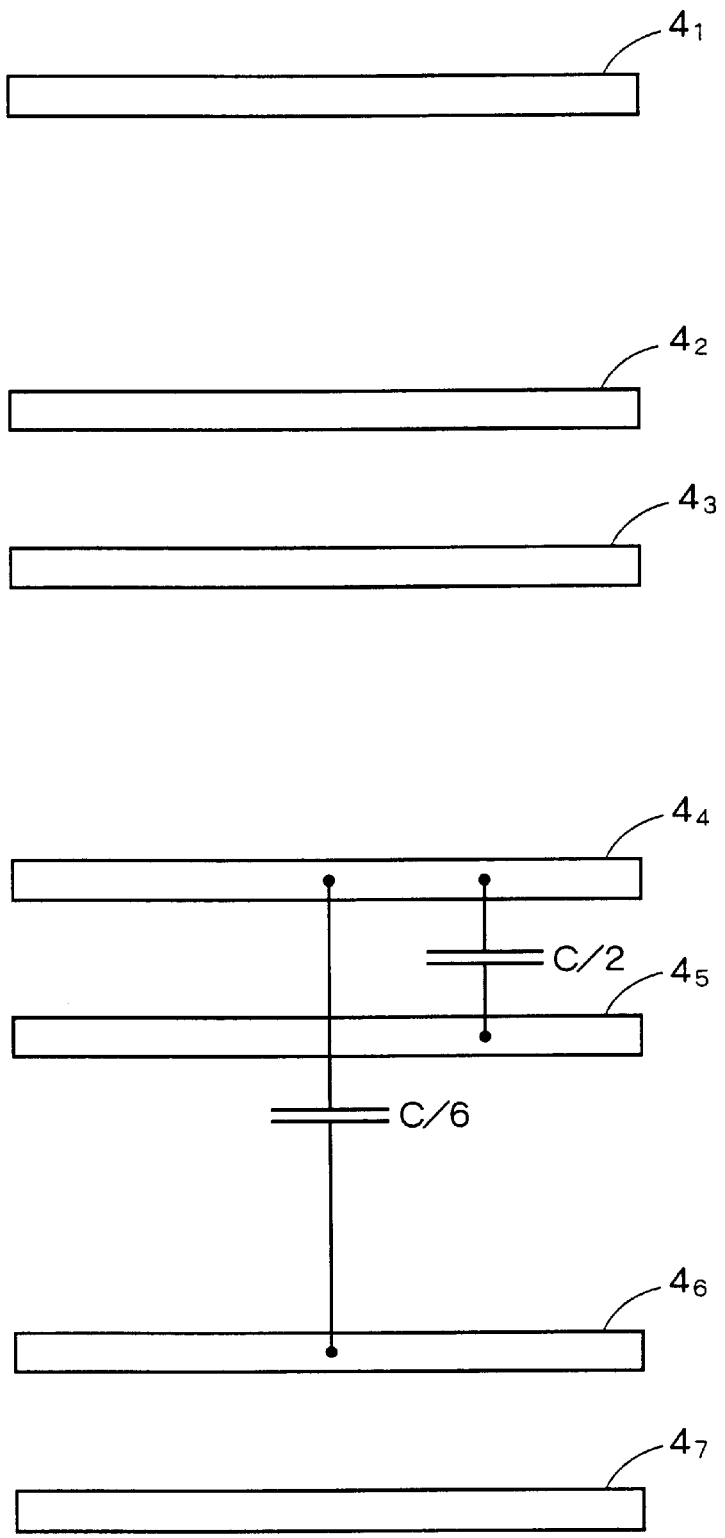
FIG. 12 shows fluctuations in the effective coupling capacitances at the time $T_2$.

FIG. 12 shows fluctuations in the effective coupling capacitances at the observed time $T_2$. As previously described, at the observed time $T_2$, the signal propagated through the signal line $4_5$ adjacent to the signal line $4_4$ and the signal propagated through the signal line $4_6$ adjacent to the signal line $4_5$ on the other side of the signal line $4_4$ make low to high transitions. Thus, with consideration for an interval of two grids between the signal lines $4_4$ and $4_5$ and an interval of six grids between the signal lines $4_4$ and $4_6$, the effective coupling capacitance between the signal line $4_4$ and $4_5$ is increased by C/2, and the effective coupling capacitance between the signal lines $4_4$ and $4_6$ is increased by C/6 at the observed time $T_2$ as shown in FIG. 12. Consequently, the total increase in the effective coupling capacitances equals to C/2+C/6=2C/3. That is, the increase in the effective coupling capacitance at the observed time $T_2$ is reduced by 11% as compared with that of the second preferred embodiment. At the observed time $T_2$, while each of the signals propagated through the signal lines $4_1$ and $4_2$ also makes a low to high transition, the signal propagated through the signal line $4_3$ between the signal line $4_4$ and the signal lines $4_1$, $4_2$ does not make a transition. Thus, the effective coupling capacitances between the signal line $4_4$ and the signal lines $4_1$, $4_2$ are not affected by the potential transitions of the signal lines $4_1$ and $4_2$.

In this manner, the auto placement and routing device according to the third preferred embodiment lays out wiring so that the interval between the signal lines having the same signal attribute becomes wider than the interval between the signal lines each having a different signal attribute, while keeping the same order of the signal lines as in the aforementioned second preferred embodiment. This relieves influences of the potential transitions of the adjacent signal lines on the observed signal line, thereby further reducing the increase in the effective coupling capacitances as compared with the second preferred embodiment.

Further, the semiconductor integrated circuit having the wiring laid out by the auto placement and routing device according to the third preferred embodiment can be more suitable for high speed and high reliability, since the increase in the effective coupling capacitance at the potential transition of the observed signal line is reduced as compared with the second preferred embodiment.

4. Fourth Preferred Embodiment

An auto placement and routing device according to a fourth preferred embodiment of the present invention has a similar structure to that of the first preferred embodiment shown in FIG. 1.

Figure 13:
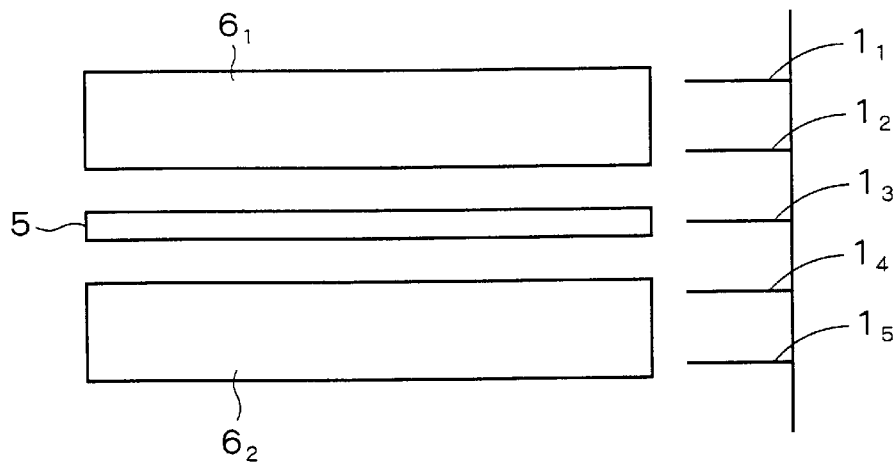
FIG. 13 schematically shows a wiring layout by an auto placement and routing device according to a fourth preferred embodiment of the present invention.

FIG. 13 schematically shows a wiring layout by the auto placement and routing device 10 according to the fourth preferred embodiment. In this layout, a signal line 5 is allotted to the grid $1_3$. Further, for wires adjacent to the signal line 5, a source wire $6_1$ is allotted to the grids $1_1$ and $1_2$, and a source wire $6_2$ is allotted to the grids $1_4$ and $1_5$. The signal attribute of the signal line 5 may be either the signal attribute A or B. In FIG. 13, each of the source wires $6_1$ and $6_2$ is placed over two grids. This is, however, only based on the assumption that the cross-sectional area of each source wire is larger than that of the signal line, and thus not intended as a definition of the limits of the present invention.

Figure 14:
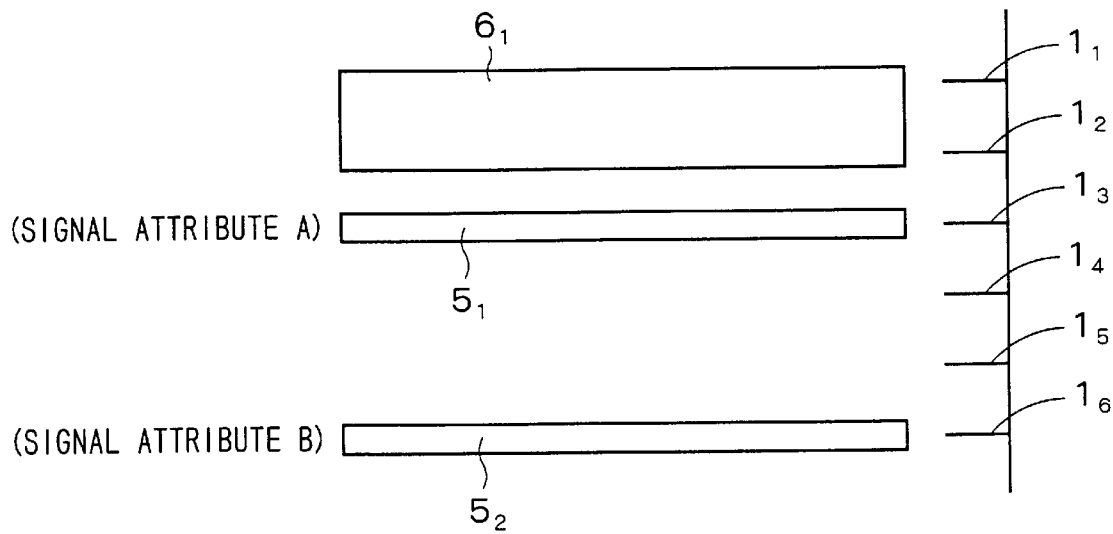
FIGS. 14 and 15 schematically show another wiring layout by the auto placement and routing device according to the fourth preferred embodiment.

FIG. 14 schematically shows another wiring layout by the auto placement and routing device 10 according to the fourth preferred embodiment. In this layout, a signal line $5_1$ is allotted to the grid $1_3$. Further, for wires adjacent to the signal line $5_1$, the source wire $6_1$ is allotted to the grids $1_1$ and $1_2$, and a signal line $5_2$ is allotted to the grid $1_6$. The signal line $5_1$ has the signal attribute A, and the signal line $5_2$ has the signal attribute B. While there was an interval of two grids between the adjacent signal lines in the aforementioned first and second preferred embodiments, in this case, there is a wider interval of three grids between the signal lines $5_1$ and $5_2$. Of course, those signal lines may be placed at two grid intervals as in the aforementioned first and second preferred embodiments.

Figure 15:
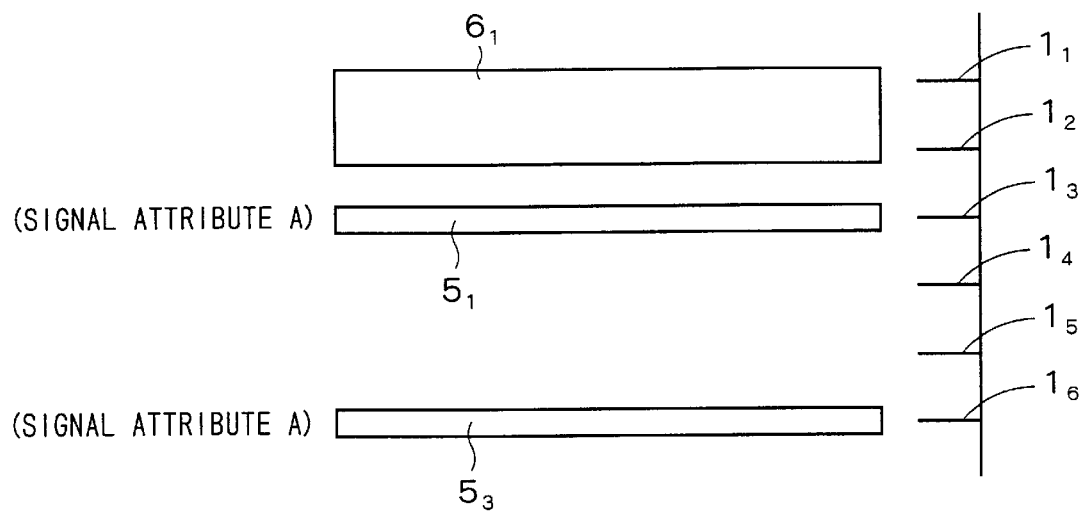

FIG. 15 further shows another wiring layout by the auto placement and routing device 10 according to the fourth preferred embodiment. In this layout, the signal line $5_1$ is allotted to the grid $1_3$. Further, for wires adjacent to the signal line $5_1$, the source wire $6_1$ is allotted to the grids $1_1$ and $1_2$, and a signal line $5_3$ is allotted to the grid $1_6$. The signal lines $5_1$ and $5_3$ have the same signal attribute A. While there was an interval of two grids between the adjacent signal lines in the aforementioned first and second preferred embodiments, in this case, there is a wider interval of three grids between the signal lines $5_1$ and $5_3$. Of course, those signal lines may be placed at two grid intervals as in the aforementioned first and second preferred embodiments.

Adopted for the signal line 5 or $5_1$ is a signal line especially susceptible to influences of signal delay, in other words, a signal line especially susceptible to influences of the increase in the effective coupling capacitance, such as the critical path or a clock wire in the circuit. More specifically, information as to delays in the signal propagation through each of the plurality of signal lines is stored in the net list. Then, on the basis of this information, the layout data generation unit 11 sets a signal line especially susceptible to influences of signal delay as the signal line 5 or $5_1$.

In this manner, the auto placement and routing device according to the fourth preferred embodiment allots the source wires $6_1$ and $6_2$ for wires adjacent to the observed signal line (5, $5_1$). The source wires $6_1$ and $6_2$ supply constant source potentials, so that there occurs no potential transition. This prevents fluctuations in the effective coupling capacitances between the signal lines 5, $5_1$ and the source wires $6_1$, $6_2$. Accordingly, the increase in the effective coupling capacitance can be reduced as compared with the case where the other signal line the potential of which makes a transition is allotted for wires adjacent to the signal line 5 or $5_1$.

Further, even if the signal lines $5_2$ and $5_3$ the potentials of which make transitions are allotted for wires adjacent to the signal line $5_1$ on the other side of the source wire $6_1$ as shown in FIGS. 14 and 15, it is possible to relieve influences of the potential transitions of the signal lines $5_2$ and $5_3$ by lengthening an interval between the signal line $5_1$ and each of the signal lines $5_2$ and $5_3$.

Furthermore, the semiconductor integrated circuit having the wiring laid out by the auto placement and routing device according to the fourth preferred embodiment can reduce the amount of delay in the signal propagation through the observed signal line, since the increase in the effective coupling capacitance of the observed signal line is reduced. This makes the circuit suitable for high speed and high reliability.

While being the source wire in the foregoing description, a wire causing no potential transition may be a ground wire. In such case, the same effect as described above can be obtained.

5. Fifth Preferred Embodiment

An auto placement and routing device according to a fifth preferred embodiment of the present invention has a similar structure as that of the first preferred embodiment shown in FIG. 1.

Each of the aforementioned preferred embodiments is based on the assumption that each transition of the signal propagated through each signal line is in perfect synchronization with the clock transition. In an actual logic circuit, however, even if the circuit is designed to operate in synchronization with the clock transition, the signal transition through each signal line will be delayed to some extent from the clock transition due to a transistor capacitance or a wiring capacitance. That is, the operation of the actual logic circuit is not in perfect synchronization with the clock transition. Now, the point of this fifth preferred embodiment is to provide a method for classifying the signal attributes of the signal lines with consideration for a predetermined tolerable time difference from the clock transition. The detail will be described below.

Figure 16:
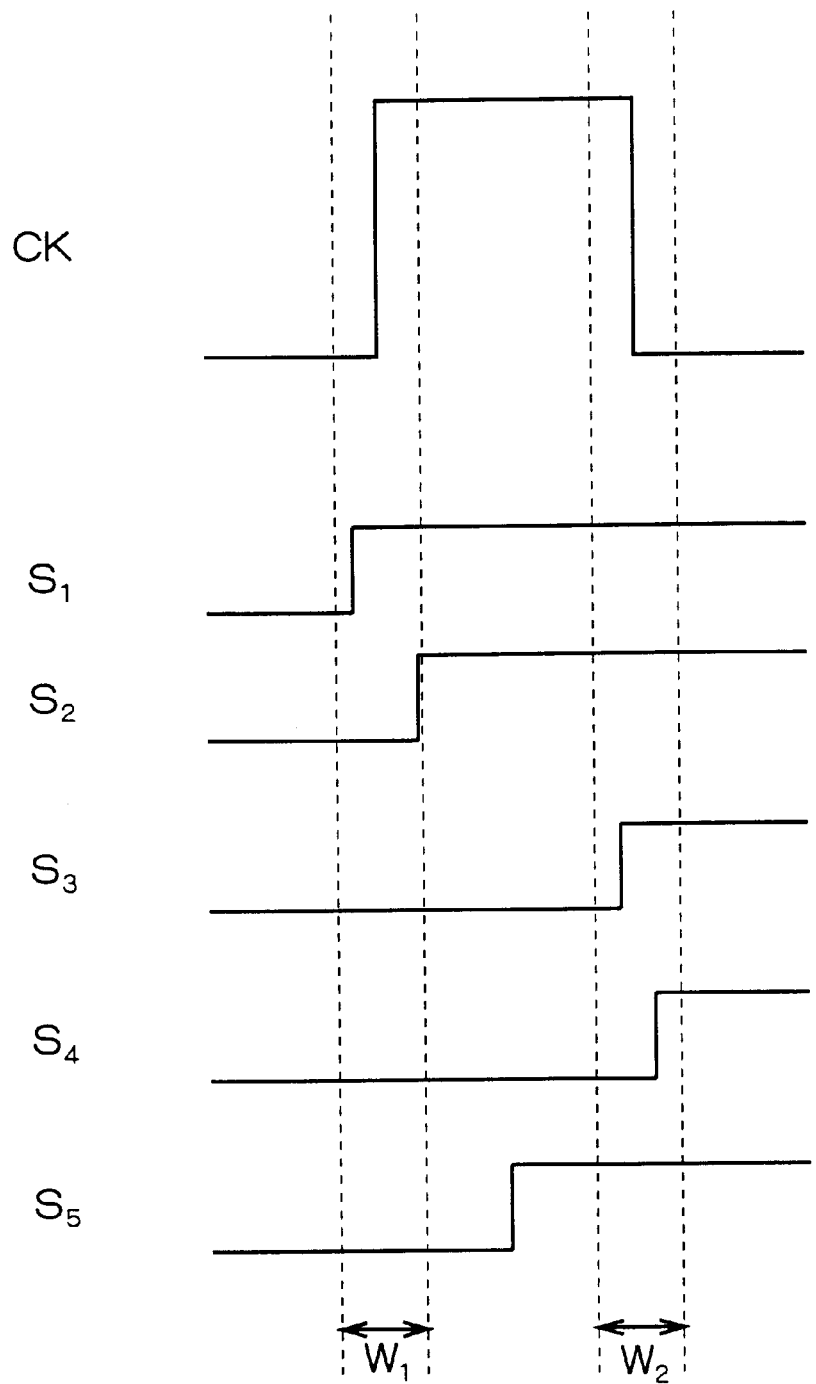
FIG. 16 is a timing chart illustrating a method for classifying signal attributes according to a fifth preferred embodiment of the present invention.
Figure 17:
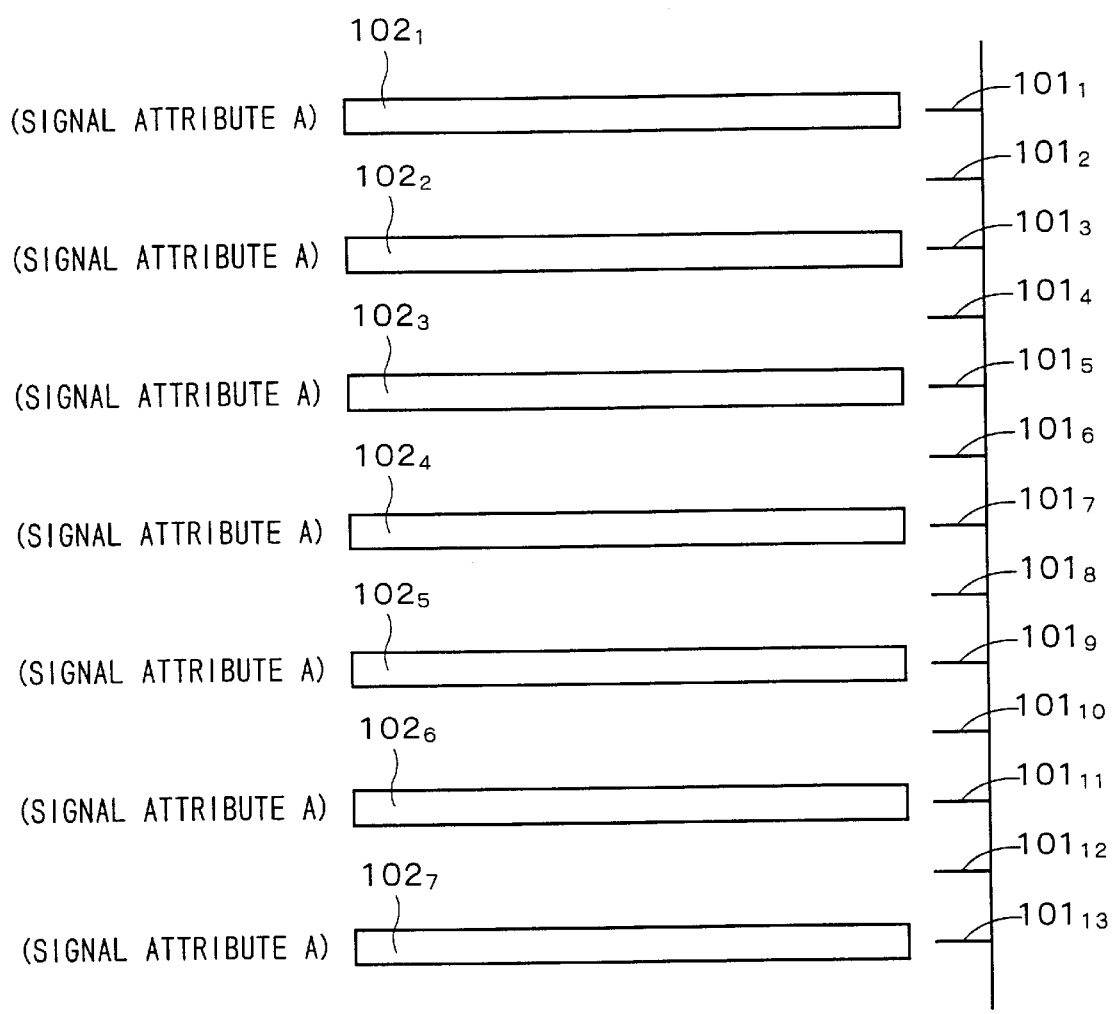
FIG. 17 schematically shows an example of a wiring layout according to a conventional auto placement and routing device.
Figure 18:
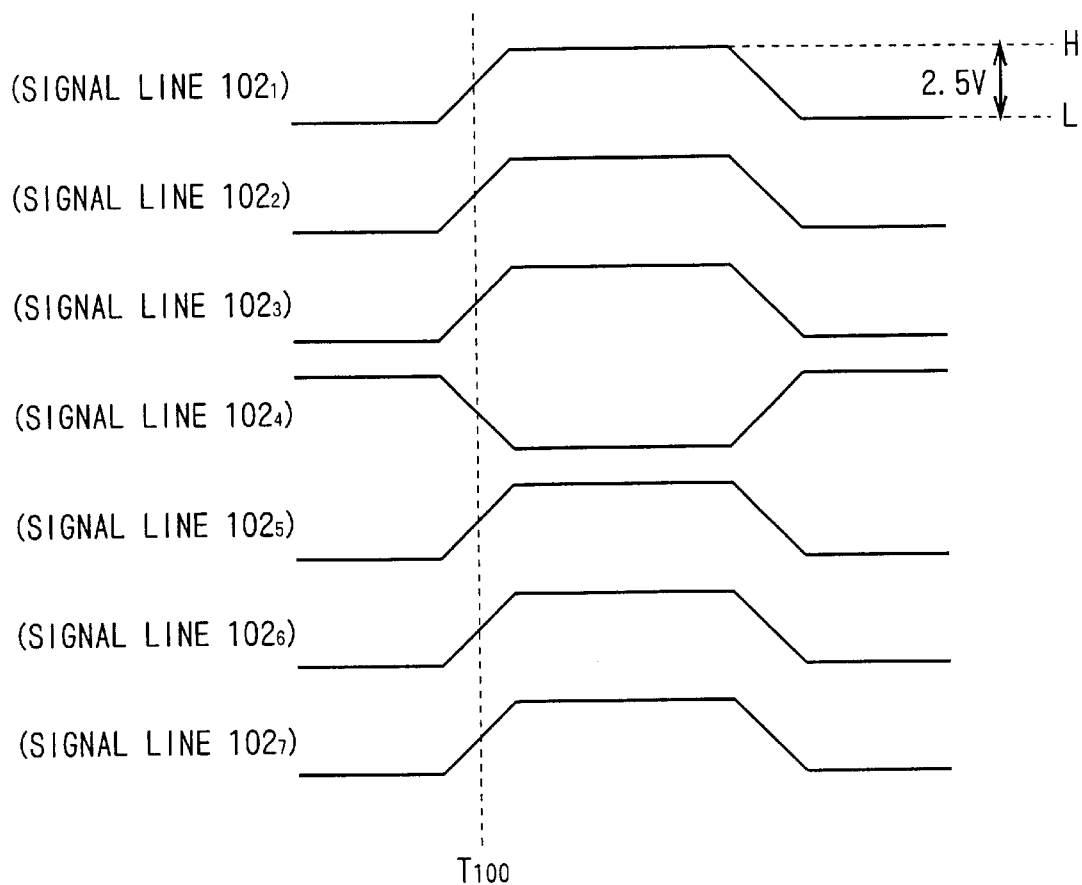
FIG. 18 is a timing chart illustrating a state of each transition of signals propagated through a plurality of signal lines, respectively.
Figure 19:
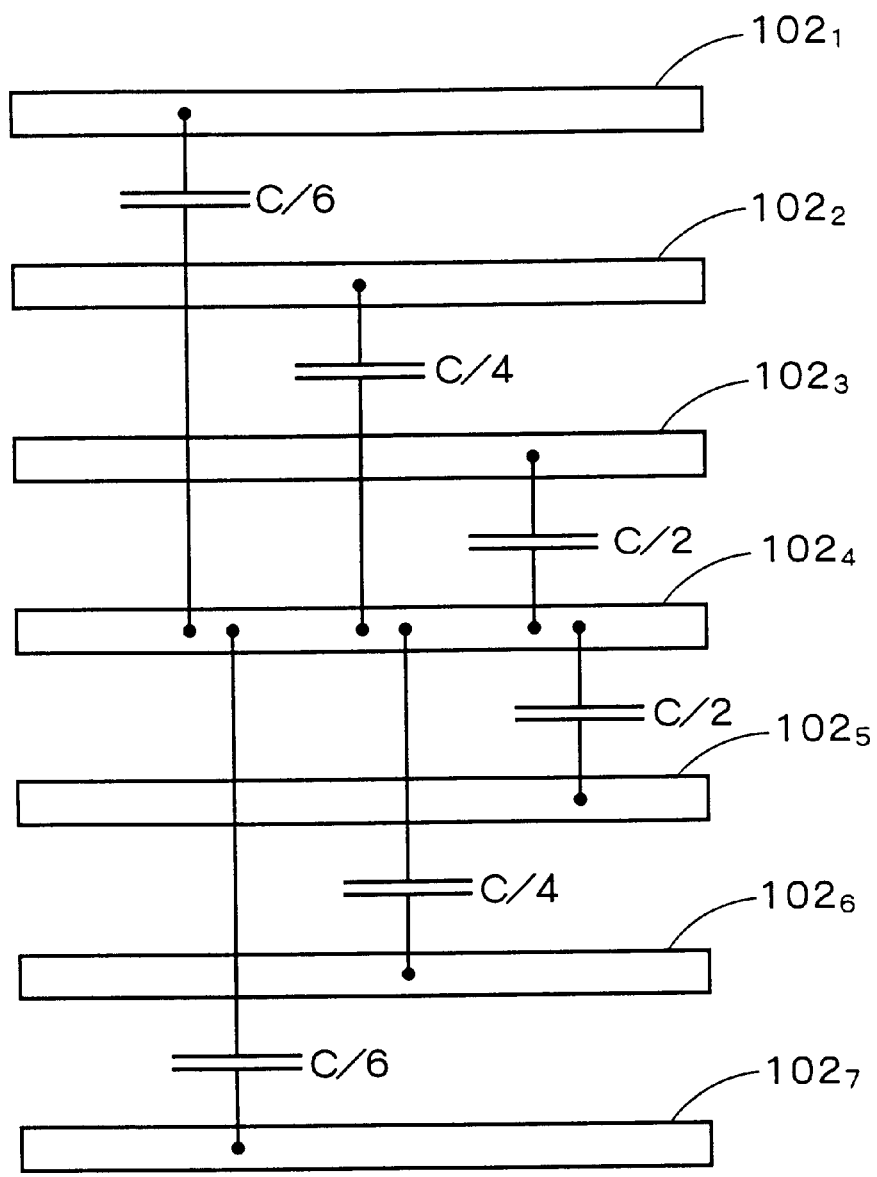
FIG. 19 shows an increase in the effective coupling capacitance between an observed signal line and each of the other signal lines.
Figure 20:
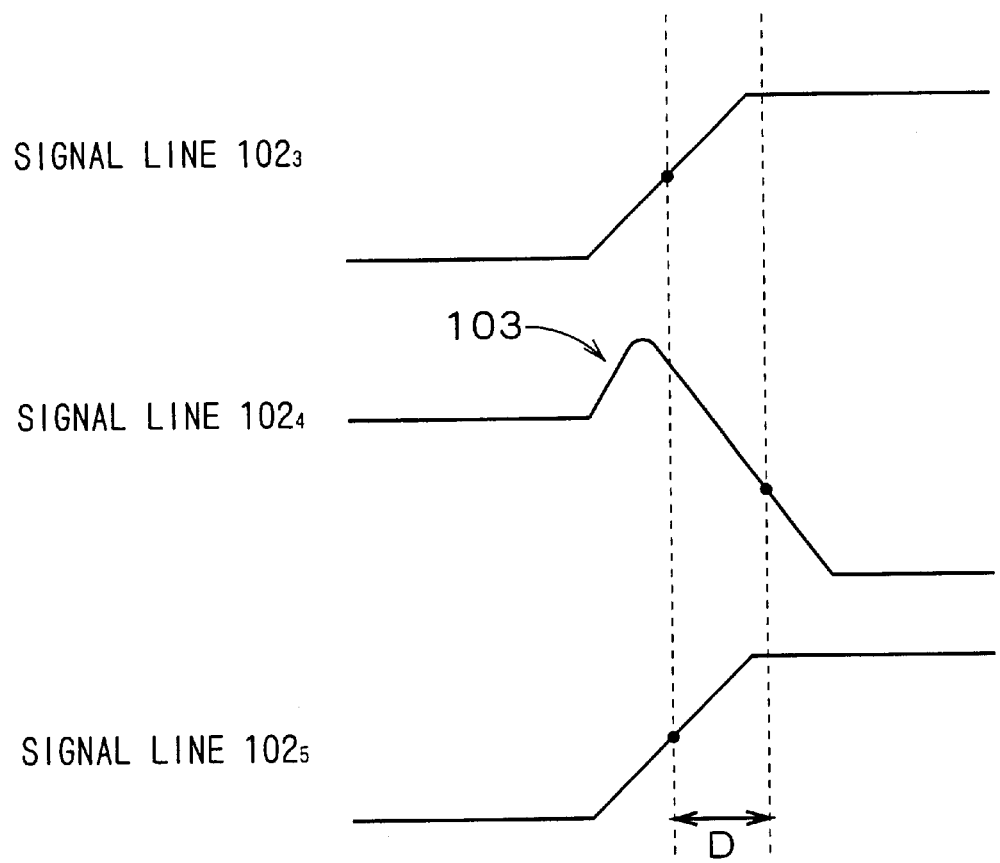
FIG. 20 is a timing chart illustrating an increase in the amount of signal delay.

FIG. 16 is a timing chart illustrating a method for classifying the signal attributes according to the fifth preferred embodiment. As shown, a difference in the rising time between signals $S_1$, $S_2$ and a clock CK is within a predetermined tolerable time difference $W_1$. Such a signal that makes a transition within a predetermined tolerable time difference from the rising time of the clock is referred to as a "signal synchronized with the rising of the clock CK." And a signal line for propagating such a signal $S_1$, $S_2$ is classified as a "signal line having the signal attribute A." Further, a difference in the falling time between signals $S_3$, $S_4$ and the clock CK is within a predetermined tolerable time difference $W_2$. Such a signal that makes a transition within a predetermined tolerable time difference from the falling time of the clock CK is referred to as a "signal synchronized with the falling of the clock CK." And a signal line for propagating such a signal $S_3$, $S_4$ is classified as a "signal line having the signal attribute B." On the other hand, a signal $S_5$ is not synchronized with the rising and the falling of the clock CK. A signal line for propagating such a signal is classified as a "signal line having a signal attribute C."

The amount of the time difference in the rising or falling time between the clock CK and each of the signals $S_1$ to $S_5$ is stored in the net list as "detailed information as to the timing of signal transition" which was described in the first preferred embodiment. Referring to the net list which includes this "detailed information as to the timing of the signal transition", the layout data generation unit 11 shown in FIG. 1 classifies the signal attributes of the signal lines, and then generates concrete layout data as to wiring on the basis of the technical ideas of the aforementioned preferred embodiment.

In this manner, the auto placement and routing device according to the fifth preferred embodiment classifies the signal attributes of the signal lines with consideration for a predetermined tolerable time difference from the clock transition. This indicates that the device is applicable to the actual form.

While the invention has been described in detail, the foregoing description is in all aspects illustrative and not restrictive. It is understood that numerous other modifications and variations can be devised without departing from the scope of the invention.

We claim:

1. A semiconductor integrated circuit comprising:
a plurality of wires placed side by side,
said plurality of wires including a plurality of first signal lines, the potentials of which make transitions at a first time,
wherein a plurality of wires adjacent to one side of each of said plurality of first signal lines are a plurality of wires the potentials of which do not make transitions at said first time, and
wherein at least one of said plurality of wires the potentials of which do not make transitions at said first time is either a source wire or a ground wire each having a substantially constant potential.

2. The semiconductor integrated circuit of claim 1, wherein
a wire adjacent to the other side of a first signal line adjacent to one side of either said source wire or said ground wire is either a source wire or a ground wire.

3. The semiconductor integrated circuit of claim 1, wherein
a wire adjacent to the other side of a first signal line adjacent to one side of either said source wire or said ground wire is a fifth signal line the potential of which makes a transition at said first time or at a second time that is different from said first time, and
an interval between said first signal line and said fifth signal line is wider than an interval between said first signal line and either said source wire or said ground wire.

4. The semiconductor integrated circuit of claim 1, wherein
a first signal line adjacent to one side of either said source wire or said ground wire is one of said plurality of first signal lines that is especially susceptible to influences of signal delay.

5. A semiconductor integrated circuit comprising:
a wiring area comprising a plurality of wiring grids;
a plurality of wires placed in said plurality of grids, with at least one grid separating adjacent ones of said wires;
said plurality of wires including a plurality of first signal lines, each of said plurality of first signal lines makes one of a rising and falling transition at a first time and the other of said rising and falling transition at a second time; and
a plurality of second signal lines, one of which is adjacent to one side of each of said first signal lines, the potential of each of said second signal lines does not undergo a potential transition at either of said first time or said second time;
one of said plurality of second signal lines being disposed adjacent to the other side of each of said first signal lines.

6. A semiconductor integrated circuit comprising:

a plurality of wires placed side by side, said plurality of wires including a plurality of first signal lines, the potentials of which make transitions at a first time, wherein a plurality of wires adjacent to one side of each of said plurality of first signal lines, is a plurality of second signal lines the potentials of each of which make transitions at a second time different than said first time; and plurality of wires adjacent to the other side of each of said plurality of first signal lines is a plurality of third signal lines the potentials of which make transitions at said second time.

7. A semiconductor integrated circuit comprising:

a plurality of wires placed side by side, said plurality of wires including a plurality of first signal lines, the potentials of which make transitions at a first time, wherein a plurality of wires adjacent to one side of each of said plurality of first signal lines is a plurality of second signal lines the potentials of each of which make transitions at a second a time different than said first time; and a plurality of wires, one of which is adjacent to the other side of each of said plurality of first signal lines, is a plurality of third signal lines the potentials of which make transitions at said first time.

8. The semiconductor integrated circuit of claim 7, wherein an interval between each of said plurality of first signal lines and each of said plurality of third signal lines is wider than an interval between each of said plurality of first signal lines and each of said plurality of second signal lines.

* * * * *